US006792040B1

(12) United States Patent
Davis et al.

(10) Patent No.: US 6,792,040 B1
(45) Date of Patent: Sep. 14, 2004

(54) MODEMS HAVING A DUAL POWER MODE CAPABILITY AND METHODS OF OPERATING SAME

(75) Inventors: Gordon Taylor Davis, Chapel Hill, NC (US); Ajay Dholakia, Gattikon (CH); Fredy D. Neeser, Langnau (CH); Malcolm Scott Ware, Raleigh, NC (US); Hua Ye, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/430,678

(22) Filed: Oct. 29, 1999

(51) Int. Cl.$^7$ ................................................ H04L 5/16
(52) U.S. Cl. ....................................................... 375/222
(58) Field of Search ................................ 375/242, 222, 375/231, 221, 219, 146, 220; 714/704; 370/523, 474, 420; 455/450, 76

(56) References Cited

U.S. PATENT DOCUMENTS

| | | | |
|---|---|---|---|
| 3,557,308 A | 1/1971 | Alexander et al. | 178/69.5 |
| 3,622,877 A | 11/1971 | MacDavid et al. | 324/73 R |
| 3,683,120 A | 8/1972 | Schenkel | 179/15 A |
| 3,729,717 A | 4/1973 | do Koe et al. | 340/172.5 |
| 4,112,427 A | 9/1978 | Hofer et al. | 340/347 |
| 4,132,242 A | 1/1979 | Carroll, Jr. | 137/263 |
| 4,208,630 A | 6/1980 | Martinez | 375/7 |
| 4,237,552 A | 12/1980 | Aikoh et al. | 370/83 |
| 4,270,027 A | 5/1981 | Agrawal et al. | 179/81 R |
| 4,434,322 A | 2/1984 | Ferrell | 178/22.13 |
| 4,450,556 A | 5/1984 | Boleda et al. | 370/58 |
| 4,577,310 A | 3/1986 | Korsky et al. | 370/58 |
| 4,578,796 A | 3/1986 | Charalambous et al. | 375/8 |
| 4,720,861 A | 1/1988 | Bertrand | 381/36 |
| 4,731,816 A | 3/1988 | Hughes-Hartogs | 379/98 |
| 4,756,007 A | 7/1988 | Qureshi et al. | 375/37 |
| 4,760,598 A | 7/1988 | Ferrell | 380/44 |
| 4,797,898 A | 1/1989 | Martinez | 375/7 |

(List continued on next page.)

FOREIGN PATENT DOCUMENTS

| | | | |
|---|---|---|---|
| EP | 0 473 116 A2 | 8/1991 | ............ H04N/1/00 |
| EP | 0 659 007 A2 | 11/1994 | .......... H04M/11/06 |
| EP | 0 669 740 A2 | 12/1994 | .......... H04L/27/00 |
| FR | 2 345 019 | 3/1976 | .......... H04L/27/10 |
| WO | WO 96/18261 | 6/1996 | .......... H04M/11/00 |
| WO | WO 98/37657 | 8/1998 | |

OTHER PUBLICATIONS

Erup, et al., *Interpolation in Digital Modems—Part II: Implementation and Performance*, IEEE Transactions on Communications, vol. 41, No. 6, pp. 998–1008 (Jun. 1993).

(List continued on next page.)

*Primary Examiner*—Stephen Chin
*Assistant Examiner*—Ted Wang
(74) *Attorney, Agent, or Firm*—Scott W. Reid; Myers Bigel Sibley & Sajovec, P.A.

(57) ABSTRACT

Modems, methods, and computer program products provide a dual power mode capability in which a maximum power limit is determined for a received signal and, based on that determination, at least one modem operational parameter is adjusted and/or digital impairment learning (DIL) sequence is selected. Adjustments made to the operational parameters may allow a modem to operate in a high power mode to achieve a higher downstream data rate. The higher downstream data rate may be attributed to an improved SNR resulting from an increase in data transmission power. Moreover, the modem may also operate in a normal power mode where the operational parameters may be set to maximize the client modem receiver's dynamic range. By selecting the DIL sequence based on the power limit, a DIL signal containing symbols having power levels within the power limit may be selected.

41 Claims, 8 Drawing Sheets

U.S. PATENT DOCUMENTS

| | | | | |
|---|---|---|---|---|
| 4,833,706 | A | 5/1989 | Hughes-Hartogs | 379/98 |
| 4,868,863 | A | 9/1989 | Hartley et al. | 379/98 |
| 4,884,285 | A | 11/1989 | Heynen et al. | 375/25 |
| 4,890,303 | A | 12/1989 | Bader | 375/107 |
| 4,890,316 | A | 12/1989 | Walsh et al. | 379/98 |
| 4,894,847 | A | 1/1990 | Tjahjadi et al. | 375/121 |
| 4,901,333 | A | 2/1990 | Hodgkiss | 375/98 |
| 4,943,980 | A | 7/1990 | Dobson et al. | 375/42 |
| 4,953,210 | A | 8/1990 | McGlynn et al. | 380/48 |
| 4,967,413 | A | 10/1990 | Otani | 371/37.4 |
| 4,972,360 | A | 11/1990 | Cukier et al. | 364/724.04 |
| 4,985,902 | A | 1/1991 | Gurcan | 375/14 |
| 4,991,169 | A | 2/1991 | Davis et al. | 370/77 |
| 4,995,030 | A | 2/1991 | Helf | 370/32.1 |
| 5,005,144 | A | 4/1991 | Nakajima et al. | 364/565 |
| 5,007,047 | A | 4/1991 | Sridhar et al. | 370/32.1 |
| 5,014,299 | A | 5/1991 | Klupt et al. | 379/98 |
| 5,033,062 | A | 7/1991 | Morrow et al. | 375/7 |
| 5,038,365 | A | 8/1991 | Belloc et al. | 375/8 |
| 5,040,190 | A | 8/1991 | Smith et al. | 375/4 |
| 5,052,000 | A | 9/1991 | Wang et al. | 371/43 |
| 5,058,134 | A | 10/1991 | Chevillat et al. | 375/39 |
| 5,065,410 | A | 11/1991 | Yoshida et al. | 375/98 |
| 5,067,125 | A | 11/1991 | Tsuchida | 370/79 |
| 5,068,875 | A | 11/1991 | Quintin | 375/78 |
| 5,107,520 | A | 4/1992 | Karam et al. | 375/60 |
| 5,111,481 | A | 5/1992 | Chen et al. | 375/14 |
| 5,119,401 | A | 6/1992 | Tsujimoto | 375/14 |
| 5,119,403 | A | 6/1992 | Krishnan | 375/39 |
| 5,134,611 | A | 7/1992 | Steinka et al. | 370/79 |
| 5,142,552 | A | 8/1992 | Tzeng et al. | 375/14 |
| 5,157,690 | A | 10/1992 | Buttle | 375/14 |
| 5,187,732 | A | 2/1993 | Suzuki | 379/5 |
| 5,210,755 | A | 5/1993 | Nagler et al. | 370/108 |
| 5,225,997 | A | 7/1993 | Lederer et al. | 364/550 |
| 5,253,272 | A | 10/1993 | Jaeger et al. | 375/60 |
| 5,253,291 | A | 10/1993 | Naseer et al. | 379/406 |
| 5,265,151 | A | 11/1993 | Goldstein | 379/97 |
| 5,285,474 | A | 2/1994 | Chow et al. | 375/13 |
| 5,291,479 | A | 3/1994 | Vaziri et al. | 370/58.2 |
| 5,311,578 | A | 5/1994 | Bremer et al. | 379/97 |
| 5,317,594 | A | 5/1994 | Goldstein | 375/8 |
| 5,351,134 | A | 9/1994 | Yaguchi et al. | 358/435 |
| 5,353,280 | A | 10/1994 | Ungerböck | 370/32.1 |
| 5,386,438 | A | 1/1995 | England | 375/121 |
| 5,394,110 | A | 2/1995 | Mizoguchi | 329/304 |
| 5,394,437 | A | 2/1995 | Ayanoglu et al. | 375/222 |
| 5,398,303 | A | 3/1995 | Tanaka | 395/51 |
| 5,402,445 | A | 3/1995 | Matsuura | 375/229 |
| 5,406,583 | A | 4/1995 | Dagdeviren | 375/5 |
| 5,418,842 | A | 5/1995 | Cooper | 379/98 |
| 5,432,794 | A | 7/1995 | Yaguchi | 371/5.5 |
| 5,434,884 | A | 7/1995 | Rushing et al. | 375/235 |
| 5,475,711 | A | 12/1995 | Betts et al. | 375/240 |
| 5,491,720 | A | 2/1996 | Davis et al. | 375/222 |
| 5,513,216 | A | 4/1996 | Gadot et al. | 375/233 |
| 5,519,703 | A | 5/1996 | Chauffour et al. | 370/84 |
| 5,528,625 | A | 6/1996 | Ayanoglu et al. | 375/222 |
| 5,528,679 | A | 6/1996 | Taarud | 379/34 |
| 5,533,048 | A | 7/1996 | Dolan | 375/222 |
| 5,534,913 | A | 7/1996 | Majeti et al. | 348/7 |
| 5,546,395 | A | 8/1996 | Sharma et al. | 370/84 |
| 5,563,908 | A | 10/1996 | Kaku et al. | 375/222 |
| 5,566,211 | A | 10/1996 | Choi | 375/332 |
| 5,598,401 | A | 1/1997 | Blackwell et al. | 379/94 |
| 5,625,643 | A | 4/1997 | Kaku et al. | 375/222 |
| 5,634,022 | A | 5/1997 | Crouse et al. | 395/704 |
| 5,640,387 | A | 6/1997 | Takahashi et al. | 370/359 |
| 5,646,958 | A | 7/1997 | Tsujimoto | 375/233 |
| 5,671,250 | A | 9/1997 | Bremer et al. | 375/222 |
| 5,694,420 | A | | 12/1997 | Ohki et al. | 375/222 |
| 5,710,792 | A | | 1/1998 | Fukawa et al. | 375/229 |
| 5,724,393 | A | | 3/1998 | Dagdeviren | 375/296 |
| 5,726,765 | A | | 3/1998 | Yoshida et al. | 358/412 |
| 5,729,226 | A | | 3/1998 | Betts et al. | 341/94 |
| 5,732,104 | A | | 3/1998 | Brown et al. | 375/222 |
| 5,734,663 | A | | 3/1998 | Eggenberger | 371/39.1 |
| 5,751,717 | A | | 5/1998 | Babu et al. | 370/466 |
| 5,751,796 | A | | 5/1998 | Scott et al. | 379/93.31 |
| 5,754,594 | A | | 5/1998 | Betts et al. | 375/285 |
| 5,757,849 | A | | 5/1998 | Gelblum et al. | 375/222 |
| 5,757,865 | A | | 5/1998 | Kaku et al. | 375/344 |
| 5,761,247 | A | | 6/1998 | Betts et al. | 375/316 |
| 5,768,311 | A | | 6/1998 | Betts et al. | 375/222 |
| 5,778,024 | A | | 7/1998 | McDonough | 375/216 |
| 5,784,377 | A | | 7/1998 | Baydar et al. | 370/463 |
| 5,784,405 | A | | 7/1998 | Betts et al. | 375/222 |
| 5,784,415 | A | | 7/1998 | Chevillat et al. | 375/341 |
| 5,793,809 | A | | 8/1998 | Holmquist | 375/242 |
| 5,796,808 | A | | 8/1998 | Scott et al. | 379/93.31 |
| 5,801,695 | A | | 9/1998 | Townshend | 375/340 |
| 5,805,669 | A | | 9/1998 | Bingel et al. | 379/28 |
| 5,809,075 | A | | 9/1998 | Townshend | 375/254 |
| 5,812,537 | A | | 9/1998 | Betts et al. | 370/286 |
| 5,815,534 | A | | 9/1998 | Glass | 375/326 |
| 5,822,371 | A | | 10/1998 | Goldstein et al. | 375/242 |
| 5,825,816 | A | | 10/1998 | Cole et al. | 375/222 |
| 5,825,823 | A | | 10/1998 | Goldstein et al. | 375/286 |
| 5,828,948 | A | * | 10/1998 | Almgren et al. | 455/450 |
| 5,831,561 | A | | 11/1998 | Cai et al. | 341/106 |
| 5,835,532 | A | | 11/1998 | Strolle et al. | 375/233 |
| 5,835,538 | A | | 11/1998 | Townshend | 375/295 |
| 5,838,724 | A | | 11/1998 | Cole et al. | 375/222 |
| 5,839,053 | A | | 11/1998 | Bosch et al. | 455/13.1 |
| 5,844,940 | A | | 12/1998 | Goodson et al. | 375/222 |
| 5,850,388 | A | | 12/1998 | Anderson et al. | 370/252 |
| 5,850,421 | A | | 12/1998 | Misra et al. | 375/354 |
| 5,852,631 | A | | 12/1998 | Scott | 375/222 |
| 5,862,141 | A | | 1/1999 | Trotter | 370/468 |
| 5,862,179 | A | | 1/1999 | Goldstein et al. | 375/242 |
| 5,862,184 | A | | 1/1999 | Goldstein et al. | 375/295 |
| 5,870,429 | A | | 2/1999 | Moran, III et al. | 375/222 |
| 5,872,817 | A | | 2/1999 | Wei | 375/341 |
| 5,881,066 | A | | 3/1999 | Lepitre | 371/20.5 |
| 5,881,102 | A | | 3/1999 | Samson | 375/222 |
| 5,887,027 | A | | 3/1999 | Cohen et al. | 375/222 |
| 5,911,115 | A | | 6/1999 | Nair et al. | 455/63 |
| 5,914,982 | A | | 6/1999 | Bjarnason et al. | 375/222 |
| 5,918,204 | A | | 6/1999 | Tsurumaru | 704/214 |
| 5,926,506 | A | | 7/1999 | Berthold et al. | 375/222 |
| 6,115,395 | A | * | 9/2000 | Norrell et al. | 370/523 |
| 6,341,360 | B1 | * | 1/2002 | Abdelilah et al. | 714/704 |
| 6,400,770 | B1 | * | 6/2002 | Townshend | 375/242 |

OTHER PUBLICATIONS

Fischer, *Signal Mapping for PCM Modems, V–pcm Rapporteur Meeting,* Sunriver, Oregon, USA, , 5 pgs. (Sep. 4–12, 1997).

Gardner, *Interpolation in Digital Modems—Part I: Fundamentals, IEEE Transactions on Communications,* vol. 41, No. 3, pp. 501–507 (Mar. 1993).

Humblet et al., *The Information Driveway, IEEE Communications Magazine,* pp. 64–68 (Dec. 1996).

Kalet et al., *The Capacity of PCM Voiceband Channels, IEEE International Conference on Communications '93,* pp. 507–511 (Geneva, Switzerland, May 23–26, 1993).

Mueller et al., *Timing Recovery in Digital Synchronous Data Receiver, IEEE Transactions on Communications,* vol. Com–24, No. 5, pp. 516–531 (May 1976).

Okubo et al., *Building Block Design of Large Capacity PCM–TDMA Subscriber System and Direct Digital Interface to Digital Exchange,* Japan Radio Co., Ltd., pp. 69–73 (Japan).

Pahlavan et al., *Nonlinear Quantization and the Design of Coded and Uncoded Signal Constellations,* IEEE Transactions on Communications, vol. 39, No. 8, pp. 1207–1215 (Aug. 1991).

Proakis, *Digital Signaling Over a Channel with Intersymbol Interference, Digital Communications,* pp. 373, 381 (McGraw–Hill Book Company, 1983).

Williams et al., *Counteracting the Quantisation Noise from PCM Codecs,* BT Laboratories, pp. 24–29 (UK).

*A Digital Modem and Analogue Modem Pair for Use on the Public Switched Telephone Network (PSTN) at Data Signalling Rates of Up to 56 000 Bit/s Downstream and 33 600 Bit/s Upstream, ITU–T V.90* (Sep. 1998).

*Series V: Data Communication Over the Telephone Network; Interfaces and voiceband modems; A modem operating at data signalling rates of up to 33 600 bit/s for use on the general switched telephone network and on leased point–to–point 2–wire telephone type circuits, ITU–T V.34* (Oct. 1996).

Bell, R.A., et al., *Automatic Speed Reduction and Switched Network Back–up,* IBM Technical Disclosure Bulletin, vol. 32, No. 1, pp. 154–157 (Jun. 1989).

Abbiate, J.C., et al., *Variable–Data Transmission Modem,* IBM Tecnical Disclosure Bulletin, vol. 17, No. 11, pp. 3301–3302 (Apr. 1975).

*Data Communication Over the Telephone Network; Procedures for Starting Sessions of Data Transmission Over the General Switched Telephone Network, ITU–T V.8* (Sep. 1994).

*Line Quality Monitoring Method,* IBM Technical Disclosure Bulletin, vol. 18, No. 8, pp. 2726–2726 (Jan. 1976).

*Loopback Tests for V.54 Data Communication Equipment,* IBM Technical Disclosure Bulletin, vol. 32, No. 3A, pp. 295–299 (Aug. 1989).

*On–Line Real Time Modem Testing,* IBM Technical Disclosure Bulletin, vol. 20, No. 6, pp. 2252–2254 (Nov. 1977).

Pierobon, Gianfranco L., *Codes of Zero Spectral Density at Zero Frequency,* IEEE Transactions on Information Theory, vol. IT–30, No. 2, pp. 435–439 (Mar. 1984).

Marcus, Brian H, et al., *On Codes with Spectral Nulls at Rational Submultiples of the Symbol Frequence,* IEEE Transactions on Information Theory, vol. IT–33, No. 4, pp. 557–568 (Jul. 1987).

Fischer, Robert, et al., *Signal Mapping for PCM Modems, ITU–Telecommunications Standardization Sector PCM '97–120, V.pcm Rapporteur Meeting,* (Sunriver, Oregon; Sep. 4–12, 1997).

*Pulse Code Modulation (PCM) of Voice Frequencies, ITU–T,* Recommendation G.711 (Geneva, 1972).

*Series G: Digital Transmission Systems: Terminal Equipments—Coding of analogue signals by pulse code modulation; Pulse code modulation (PCM) of voice frequencies, ITU–T,* Recommendation G.711 (Geneva, 1996).

*Data Communication Over the Telephone Network; Error-Correcting Procedures for DCEs Using Asynchronous–to–Synchronous Conversion, ITU–T V.42* (Mar. 1993).

*Improvement to Spectral Shaping Techniques,* Research Disclosure, V. 41, n415,415111, pp. 1550–1551 (Nov. 1998).

*TIA Standard Draft: North American Telephone Network Transmission Model for Evaluating Analog Client to Digitally Connected Server Modems,* Telecommunications Industry Association, PN3857, Draft 10 (Feb. 1999).

Davis, Gordon T., *DSP and MATLAB implementation of model–based constellation generation* (Sep. 18, 1998).

Woodruff, K.R, et al, *Automatic and Adaptive System and Efficient Communication in Noisy Communication Line Environments,* IBM Technical Disclosure Bulletin, vol. 24, No. 9, pp. 4627–4629 (Feb. 1982).

Godard, D., et al., *Decision Feedback Equalizer Stabilization in Adaptive Mode,* IBM Technical Disclosure Bulletin, vol. 24, No. 11A, pp. 5691–5692 (Apr. 1982).

Borgnis–Desbordes, P., et al. *Variable–Speed Data Transmission,* IBM Technical Disclosure Bulletin, vol. 27, No. 4A, pp. 2269–2270 (Sep. 1984).

Couland, G., et al., *Analog Wrap Self–Tests in Modems During Retrain Operations,* IBM Technical Disclosure Bulletin, vol. 28, No. 6, p. 2457 (Nov. 1985).

Maddens, F., *Sixteen–State Forward Convolutional Encoder,* IBM Technical Disclosure Bulletin, vol. 28, No. 6, pp. 2466–2468 (Nov. 1985).

*Remote Modem–Type Self–Learning,* IBM Technical Disclosure Bulletin, vol. 28, No. 6, pp. 2398–2399 (Nov. 1985).

Maddens, F., *Sixteen–State Feedback Convolutional Encoder,* IBM Technical Disclosure Bulletin, vol. 28, No. 10, pp. 4212–4213 (Mar. 1986).

Bell, R. A., et al., *Automatic Speed Reduction and Switched Network Back–up,* IBM Technical Disclosure Bulletin, vol. 32, No. 1, pp. 154–157 (Jun. 1989).

Nobakht, R.A., *Trellis–Coded Modulation Coding Scheme for a 19/2 Kbps Modem,* IBM Technical Disclosure Bulletin, vol. 36, No. 11, pp. 167–170 (Nov. 1993).

Nobakht, R.A. *Unified Table Based Subset Decoder for the Viterbi Algorithm,* IBM Technical Disclosure Bulletin, vol. 37, No. 09, pp. 581–587 (Sep. 1994).

Nobakht, R.A., *Trellis Subset Decoder Algorithm Based on a Pattern Recognition Scheme,* IBM Technical Disclosure Bulletin, vol. 37, No. 10, pp. 693–697 (Oct. 1994).

Abbiate, J.C., et al, *Variable–Data Transmission Modem,* IBM Technical Disclosure Bulletin, vol. 17, No. 11, pp. 3301–3302 (Apr. 1975).

Barlet, J., et al., *Full Speed Recovery in High Speed Modems,* IBM Technical Disclosure Bulletin, vol. 17, 23, No. 2, pp. 641–643 (Jul. 1980).

Dialog Abstract, *Sample rate converter for duplex modem,* European Patent No. 285413.

Dialog Abstract, *Two–speed full–duplex modem for telephone network,* PCT WO 8501407.

Dialog Abstract, *Digital data transmission system,* European Patent No. 124674.

Dialog Abstract, *Facsimile communication controller,* Japanese Publication No. 04–175060 (Jun. 23, 1992).

Dialog Abstract, *Picture communication equipment,* Japanese Publication No. 03–120954 (May 23, 1991).

Dialog Abstract, *Radio date transmission,* Japanese Publication No. 01–179535 (Jul. 17, 1989).

Dialog Abstract, *Facsimile device,* Japanese Publication No. 57–164654 (Oct. 9, 1982).

Dialog Abstract, *Data repeater,* Japanese Publication No. 57–087255 (Mar 31, 1982).

Dialog Abstract, *Blinding training method for decision feedback equaliser having feed–forward and feedback filters,* European Patent No. 880253.

Dialog Abstract, *Processing method for distorted signal received by qam receiver,* European Patent No. 465851.

Dialog Abstract, *Establishing wireless communication channel,* PCT No. WO 9905820.

Dialog Abstract, *High–speed rate adaptive subscriber line digital data modem,* PCT No. WO 9830001.

Dialog Abstract, *Digital modem in digital modulation system,* Japanese Patent No. 8116341.

Dialog Abstract, *Communication equipment and radio communication adapter,* Japanese Publication No. 08–340289 (Dec. 24, 1996).

Dialog Abstract, *Data recording method,* Japanese Publication No. 05–089597 (Apr. 9, 1993).

Dialog Abstract, *Transmission control system for data communication and its modem equipment,* Japanese Publication No. 02–228853 (Sep. 11, 1990).

Nabuib, A.F., et al., Dialog Abstract, *A space–time coding modem for high–data–rate wireless communication,* IEEE Journal of Selected Areas in Communications, vol. 16, No. 8, pp. 1459–1478 (Oct. 1998).

Denno, S., et al., Dialog Abstract, *Mbit/s burst modem with an adaptive equalizer for TDMA mobile radio communication,* IEICE Transactions on Communications, vol. E81–B, No. 7, pp. 1453–1461 (Jul. 1998).

Naguib, A.F., et al., Dialog Abstract, *A space–time coding modem for high–data–rate wireless communications,* GLOBECOM 97, IEEE Global Telecommunications Conference, vol. 1, pp. 102–109 (1997).

Kobayashi, K., et al., Dialog Abstract, *Fully digital burst modem for satellite multimedia communications sytems,* IEICE Transactions on Communications, vol. E80–B, No. 1, pp. 8–15 (Jan. 1997).

Skellern, D.J., et al., Dialog Abstract, *A high speed wireless LAN,* IEEE Micro, vol. 17, No. 1, pp. 40–47 (Jan.–Feb. 1997).

Enomoto, K., et al., Dialog Abstract, *A mode switching type burst demodulator AFC,* Transactions of the Institute of Electronics, Information and Communication Engineers, vol. J76B–II, No. 5, pp. 415–421 (May 1993).

Betts, W., Dialog Abstract, *Nonlinear encoding by surface projection,* International Conference on Data Transmission—Advances in Modem and ISDN Technology and Applications (Sep. 23–25, 1992).

Schilling, D.L., et al., Dialog Abstract, *The FAVR meteor burst communication experiment,* Military Communications in a Changing World MILCOM '91 (Nov. 4–7, 1991).

Jacobsmeyer, J.M., Dialog Abstract, *Adaptive trellis–coded modulation for bandlimited meteor burst channels,* IEEE Journal of Selected Areas in Communications, vol. 10, No. 3, pp. 550–561 (Apr. 1992).

Sato, T., et al., Dialog Abstract, *Protocol configuration and verification of an adaptive error control scheme over analog cellular networks,* IEEE Transactions on Vehicular Technology, vol. 41, No. 1, pp. 69–76 (Feb. 1992).

Lee, L.–N., et al., Dialog Abstract, *Digital signal processor–based programmable BPSK/QPSK/offset–QPSK modems,* COMSAT Technical Review, pp. 195–234 (Fall 1989).

Sato, T., et al., Dialog Abstract, *Error–free high–speed data modem,* Oki Technical Review, vol. 56, No. 133, pp. 20–26 (Apr. 1989).

Seo, J.–S, et al., Dialog Abstract, *Performance of convolutional coded SQAM in hardlimited satellite channels,* IEEE International Conference on Communications BOSTON-ICC/89, vol. 2, pp. 787–791 (Jun. 11–14, 1989).

Murakama, K., et al., Dialog Abstract, *FEC combined burst–modem for business satellite communications use,* IEEE/IECE Global Telecommunications Conference 1987, vol. 1, pp. 274–280 (Japan, Nov. 15–18, 1987).

McVerry, F., Dialog Abstract, *Performance of a fast carrier recovery scheme for burst–format DQPSK transmission over satellite channels,* International Conference on Digital Processing of Signals in Communications, pp. 165–172 (United Kingdom, 1985).

Filter, J.H.J., Dialog Abstract, *An algorithm for detecting loss of synchronisation in data transmission test sets (modems),* Transactions of the South African Institute of Electrical Engineers, vol. 76, No. 1, pp. 39–43 (Jan. 1985).

Gersho, A., Dialog Abstract, *Reduced complexity implementation of passband adaptive equlizers,* IEEE Journal on Selected Areas in Communications, vol. SAC–2, No. 5, pp. 778–779 (Sep. 1984).

Dialog Abstract, *High–speed full–duplex modem reduces telephone connect time,* EDN, vol. 27, No. 18, p. 77 (Sep. 15, 1982).

Chadwick, H., Dialog Abstract, *Performance of a TDMA burst modem through a dual nonlinear satellite channel,* Fifth International Conference on Digital Satellite Communications, pp. 63–67 (Italy, Mar. 23–26, 1981).

Nussbaumer, H., Dialog Abstract, *Reducing the acquisition time in an automatic equalizer,* IBM Technical Disclosure Bulletin, vol. 18, No. 5, pp. 1465–1479 (Oct. 1975).

Uzunoglu, V., et al., Dialog Abstract, *Synchronous and the coherent phase–locked synchronous oscillators: new techniques in synchronization and tracking,* IEEE Transactions on Circuits and Systems, vol. 36, No. 7, pp. 997–1004 (Jul. 1989).

Minei, I., et al., Dialog Abstract, *High–speed Internet access through unidirectional geostationary satellite channels,* IEEE Journal on Selected Areas in Communications, vol. 17, No. 2, pp. 345–359 (Feb., 1999).

Ovadai, S., Dialog Abstract, *The effect of interleaver depth and QAM channel frequencey offset on the performance of multichannel AM–VSB/256–QAM video lightwave transmission systems,* International Conference on Telecommunications: Bridging East and West Through Communications, vol. 1, pp. 339–343 (Greece, Jun. 21–25, 1998).

Johnson, R.W., et al., Dialog Abstract, *Error correction coding for serial–tone HG transmission,* Seventh International Conference on HF Radio Systems, and Techniques, pp. 80–84 (United Kingdom, Jul. 7–10, 1997).

Karasawa, Y., et al., Dialog Abstract, *Cycle slip in clock recovery on frequency–selective fading channels,* IEEE Transactions on Communications, vol. 45, No. 3, pp. 376–383 (Mach. 1997).

Umehira, M., et al., Dialog Abstract, *design and performance of burst carrier recovery using a phase compensated filter,* Transactions of the Institute of Electronics, Information and Communication Engineers, vol. J78B–II, No. 12, pp. 735–746 (Dec. 1995).

De Bot, P., et al., Dialog Abstract, *An example of a multi--resolution digital terrestrial TV modem,* Proceedings of ICC '93—IEEE International Conference on Communications, vol. 3, pp. 1785–1790 (Switzerland, May 23–26, 1993).

Lei, Chen, et al., Dialog Abstract, *Single–tone HF High speed data modem*, Proceedings of Tencon '93—IEEE Region 10 International Conference on Computers, Communications and Automation, vol. 3, pp. 94–98 (China, Oct. 19–21, 1993).

Woerner, B.D., et al., Dialog Abstract, *Simulation issues for future wireless modems*, IEEE Communications, vol. 32, No. 7, pp. 42–53 (Jul. 1994).

Sato, T., et al., Dialog Abstract, *Vehicle terminal equipment with dedicated DSP*, Oki Technical Review, vol. 58, No. 144, pp. 49–52 (Jul. 1992).

Tamm, Yu.A., Dialog Abstract, *The effect of suppressing harmonic interference using an adaptive equalizer*, Elektrosvyaz, vol. 45, No. 3, pp. 5–10 (Mach. 1990).

Saleh, A.A.M., et al., Dialog Abstract, *An experimental TDMA indoor radio communications system using slow frequency hopping and coding*, IEEE Transactions on Communications, vol. 39, No. 1, pp. 152–162 (Jan. 1991).

Nergis, A., Dialog Abstract, *Optimum HF digital communications sytems with block coding and interleaving techniques*, Proceedings of the 1990 Bilkent International Conference on New Trends in Communication, Control and Signal Processing, vol. 1, pp. 511–517 (Turkey, Jul. 2–5, 1990).

Kawamata, F., et al., Dialog Abstract, *An evaluation of voice codecs and facsimiles*, Review of the Communications Research Laboratory, vol. 36, pp. 69–73 (Mar. 1990).

Sato, T., et al., Dialog Abstract, *Error–free high–speed data transmission protocol simultaneously applicable to both wire and mobile radio channels*, 38$^{th}$ IEEE Vehicular Technology Conference: 'Telecommunications Freedom—Technology on the Move', pp. 489–496 (Jun. 15–17, 1988).

Dialog Abstract, *1200–bit/s cellular modem DLD03H*, Oki Technical Review, vol. 53, No. 127, pp. 70–72 (Jul. 1987).

Chamberlin, J.W., et al., Dialog Abstract, *Design and field test of a 256–QAM DIV modem*, IEEE Journal on Selected Areas in Communications, vol. SAC–5, No. 3, pp. 349–356 (Apr. 1987).

De Cristofaro, R., et al., Dialog Abstract, *A 120 Bv/s QPSK modem designed for the INTELSAT TDMA network*, International Journal of Satellite Communications, vol. 3, Nos. 1–2, pp. 145–160 (Jan.Jun., 1985).

Shumate, A., Dialog Abstract, *Error correction coding for channels subject to occasional losses of bit count integrity*, IEEE Military Communications Conference, vol. 1, pp. 89–93 (Oct. 21–24, 1984).

Suyderhoud, H., et al., Dialog Abstract, *Investigation of 9.6 kb/s data transmission via a PCM link at 64 kb/s with and without link errors*, International Journal of Satellite Communications, vol. 2, No. 1, pp. 81–87 (Jan.–Mar. 1984).

Smith, C., Dialog Abstract, *Relating the performance of speech processors to the bit error rate*, Speech Technology, vol. 2, No. 1, pp. 41–53 (Sep.–Oct. 1983).

Suyderhoud, H., et al., Dialog Abstract, *Investigation of 9.6–kbit/s data transmission via a PCM link at 64 kbit/s with and without link errors*, Sixth International Conference on Digital Satellite Communications Proceedings, pp. 26–33 (Sep. 19, 23, 1983).

Kittel, L., Dialog Abstract, *Analogue and discrete channel models for signal transmission in mobile radio*, Frequenz., vol. 36, Nos. 4–5, pp. 153–160 (Apr.–May 1982).

Farrell, P.G., et al., Dialog Abstract, *Soft–decision error control of h.f. data transmission*, IEE Proceedings F (Communications, Radar and Signal Processing), vol. 127, No. 5, pp. 389–400 (Oct. 1980).

Johnson, A.L., Dialog Abstract, *Simulation and implementation of a modulation system for overcoming ionospheric scintillation fading*, AGARD Conference Proceedings No. 173 on Radio Systems, and the Ionosphere, pp. 3/1–5 (Greece, May 26–30, 1975).

Matsumura, K., et al., Dialog Abstract, *Anti–interference data–transmission set of HF radio equipment*, Mitsublishi Electric Engineer, No. 41, pp. 18–23 (Sep., 1974).

Blank, H.A., et al., Dialog Abstract, *A Markov error channel model*, 1973 National Telecommunications Conference, vol. 1, pp. 15B/1–8 (Nov. 26–28, 1973).

McGruther, W.G., Dialog Abstract, *Long term error performance data for operation at 2400 bps ona nonswitched private line network*, Summaries of papers presented at 1970 Canadian symposium on communications, pp. 65–66 (Canada, Nov. 12–13, 1970).

Burton, H.O., et al., Dialog Abstract, *On the use of error statistics from data transmission on telephone facilities to estimate performance of forward–error–correction*, 1970 international conference on communications, p. 21 (Jun. 8–10, 1970).

Bowen, R.R., Dialog Abstract, *Application on burst error correction codes to data modems for dispersive channels*, Proceedings of the 1970 international symposium on information theory, p. 1 (Netherlands, Jun. 15–19, 1970).

Pierce, A.W., et al., Dialog Abstract, *Effective application of forward–acting error–control coding to multichannel h.f. data modems*, IEEE Transactions on Communication Technology, vol. Com–18, No. 4, pp. 281–294 (Aug. 1970).

West, R.L., Abstract, *Data Concentration Method*, IBM Technical Dislcosure Bulletin, pp. 487–489; http://w3.infogate.ibm.com:1207/SESS506884/GETDOC/39/2/1 (Jul., 1975).

Haas, L.C., et al., Abstract, *Received Line Signal Quality Analysis*, IBM Technical Disclosure Bulletin, pp. 5414–5416; http://w3.infogate.ibm.com:1207/SESS506884/GETDOC/43/1/1 (May, 1981).

Nussbaumer, H., Abstract, *Reducing the Acquisition Time in an Automatic Equalizer*, IBM Technical Disclosure Bulletin, pp. 1465–1479; http://w3.infogate.ibm.com:1207/SESS506884/GETDOC/40/2/1 (Oct. 1975).

Dialog Abstract, *Listener echo canceller for digital communication system*, PCT No. WO 9310607.

Dialog Abstract *Reduced time remote access method for modem computer*, PCT No. WO 9209165.

\* cited by examiner

MODEMS HAVING A DUAL POWER MODE CAPABILITY AND METHODS OF OPERATING SAME

FIELD OF THE INVENTION

The present invention relates generally to the field of communication, and, more particularly, to power mode control in a modem, such as an analog/client PCM modem according to the ITU-T Recommendation V.90.

BACKGROUND OF THE INVENTION

The demand for remote access to information sources and data retrieval, as evidenced by the success of services such as the World Wide Web, is a driving force for high-speed network access technologies. The public switched telephone network (PSTN) offers standard voice services over a 4 kHz bandwidth. Traditional analog modem standards generally assume that both ends of a modem communication session have an analog connection to the PSTN. Because voice or modem signals are typically converted from analog to digital when transmitted towards the PSTN and then from digital to analog when received from the PSTN, data rates may be limited to 33.6 kbps as defined in the ITU-T Recommendation V.34 developed by the International Telecommunications Union (ITU).

The need for an analog modem may be eliminated, however, by using the basic rate interface (BRI) of the Integrated Services Digital Network (ISDN). A BRI offers end-to-end digital connectivity at an aggregate data rate of 160 kbps, which is comprised of two 64 kbps B channels, a 16 kbps D channel, and a separate maintenance channel. ISDN offers comfortable data rates for Internet access, telecommuting, remote education services, and some forms of video conferencing. ISDN deployment, however, has generally been very slow due to the substantial investment required of network providers for new equipment. Because ISDN is not very pervasive in the PSTN, the network providers have typically tariffed ISDN services at relatively high rates, which may be ultimately passed on to the ISDN subscribers. In addition to the high service costs, subscribers must generally purchase or lease network termination equipment to access the ISDN.

While most subscribers do not enjoy end-to-end digital connectivity through the PSTN, the PSTN is nevertheless mostly digital. Typically, the only analog portion of the PSTN is the phone line or local loop that connects a subscriber or client modem (e.g., an individual subscriber in a home, office, or hotel) to the telephone company's central office (CO). Local telephone companies have been replacing portions of their original analog networks with digital switching equipment. Nevertheless, the connection between the home and the CO has been the slowest to change to digital as discussed in the foregoing with respect to ISDN BRI service. A recent data transmission recommendation issued by the ITU, known as ITU-T V.90, takes advantage of the digital conversions that have been made in the PSTN. By viewing the PSTN as a digital network, V.90 technology can accelerate data downstream from the Internet or other information source to a subscriber's computer at data rates of up to 56 kbps, even when the subscriber is connected to the PSTN via an analog local loop.

To understand how the V.90 Recommendation achieves this higher data rate, it may be helpful to briefly review the operation of V.34 analog modems. V.34 modems are generally optimized for a configuration in which both ends of a communication session are connected to the PSTN by analog lines. Even though most of the PSTN is digital, V.34 modems treat the network as if it were entirely analog. Moreover, the V.34 Recommendation assumes that both ends of the communication session suffer impairment due to quantization noise introduced by analog-to-digital converters. That is, the analog signals transmitted from the V.34 modems are sampled at 8000 times per second by a codec upon reaching the PSTN with each sample being quantized to a discrete PCM quantization level that is represented by an eight-bit pulse code modulation (PCM) codeword. The codec uses 256, non-uniformly spaced, PCM quantization levels defined according to either the $\mu$-law or A-law coding law (i.e., the ITU G.711 Recommendation).

Because the analog waveforms are continuous and the binary PCM codewords are discrete, the digits that are sent across the PSTN can only approximate the original analog waveform. The difference between the original analog waveform and the reconstructed quantized waveform is called quantization noise, which limits the modem data rate.

In a V.34 connection, quantization noise may limit data rates to less than 33.6 kbps. The V.90 standard relies on the lack of 8-bit analog-to-digital conversions in the downstream path, to enable downstream data transmission at up to 56 kbps.

The general environment for which the V.90 standard has been developed is depicted in FIG. 1. An Internet Service Provider (ISP) 22 is connected to a subscriber's computer 24 via a V.90 digital server modem 26, through the PSTN 28 via digital trunks (e.g., T1, E1, or ISDN Primary Rate Interface (PRI) connections), through a central office switch 32, and finally through an analog loop to the client's modem 34. The central office switch 32 is drawn outside of the PSTN 28 to better illustrate the connection of the subscriber's computer 24 and modem 34 into the PSTN 28. It should be understood that the central office 32 is, in fact, a part of the PSTN 28. The operation of a communication session between the subscriber 24 and an ISP 22 is best described with reference to the more detailed block diagram of FIG. 2.

Transmission from the server modem 26 to the client modem 34 uses pulse amplitude modulation (PAM) and will be described first. The information to be transmitted is first encoded using only the 256 PCM codewords used by the digital switching and transmission equipment in the PSTN 28. These PCM codewords are transmitted towards the PSTN 28 by the PAM transmitter 36 where they are received by a network codec. The PCM data is then transmitted through the PSTN 28 until reaching the central office 32 to which the client modem 34 is connected. The PCM data are converted to analog voltage levels by the codec expander (digital-to-analog converter) 38 according to the PCM law. These voltage levels are processed by a central office hybrid 42 where the unidirectional signal received from the codec expander 38 is transmitted towards the client modem 34 as part of a bidirectional signal. A second hybrid 44 at the subscriber's analog telephone connection converts the bidirectional signal back into a pair of unidirectional signals. Finally, the analog signal from the hybrid 44 is converted into digital PAM samples by an analog-to-digital (A/D) converter 46, which are received and decoded by the PAM receiver 48. Note that for transmission to succeed effectively at 56 kbps, there must not be any 8-bit PCM analog-to-digital conversion between the server modem 26 and the client modem 34. Recall that analog-to-digital conversions in the PSTN 28 may introduce quantization noise, which may limit the data rate as discussed hereinbefore. The A/D converter 46 at the client modem 34, however, typically has a higher resolution than the A/D converters used in the analog portion of the PSTN 28 (e.g., 16 bits versus 8 bits), which results in less quantization noise. Moreover, the PAM receiver 48 needs to be in synchronization with the 8 kHz network clock to properly decode the digital PAM samples.

Transmission from the client modem 34 to the server modem 26 uses quadrature amplitude modulation (QAM) and follows the V.34 data transmission standard. That is, the client modem 34 includes a QAM transmitter 52 and a D/A converter 54 that encode and modulate the digital data. The hybrid 44 converts the unidirectional signal from the digital-to-analog converter 54 into a bidirectional signal that is transmitted to the central office 32. Once the signal is received at the central office 32, the central office hybrid 42 converts the bidirectional signal into a unidirectional signal that is provided to the central office codec. This unidirectional, analog signal is converted into either $\mu$-law or A-law PCM codewords by the codec compressor (A/D converter) 56, which are then transmitted through the PSTN 28 until reaching the server modem 26. The server modem 26 includes a conventional V.34 receiver 58 for demodulating and decoding the data sent by the QAM transmitter 52 in the client modem 34. Thus, data is transferred from the client modem 34 to the server modem 26 at data rates of up to 33.6 kbps as provided for in the V.34 standard.

As described above, the digital portion of the PSTN 28 transmits information using eight-bit PCM codewords at a frequency of 8000 Hz. Thus, it would appear that downstream transmission should take place at 64 kbps rather than 56 kbps as defined by the V.90 standard. While 64 kbps is a theoretical maximum, several factors prevent actual transmission rates from reaching this ideal rate. First, even though the problem of quantization error has been substantially reduced by using PCM encoding and PAM for transmission, additional noise in the network or at the subscriber premises, such as non-linear distortion and crosstalk, may limit the maximum data rate. Furthermore, the PCM encoding technique does not use uniformly spaced voltage levels for representing data. The PCM codewords representing very low levels of sound have PAM voltage levels spaced close together. Noisy transmission facilities may prevent these PAM voltage levels from being distinguished from one another thereby causing loss of data. Accordingly, to provide greater separation between the PAM voltages used for transmission, not all of the 256 PCM codewords are used.

It is generally known that, assuming a convolutional coding scheme, such as trellis coding, is not used, the number of symbols required to transmit a certain data rate is given by Equation 1:

$$bps = R_s \log_2 N_s \qquad \text{EQ. 1}$$

where bps is the data rate in bits per second, $R_s$ is the symbol rate, and $N_s$ is the number of symbols in the signaling alphabet or constellation. To transmit at 56 kbps using a symbol rate of 8000, Equation 1 can be rewritten to solve for the number of symbols required as set forth below in Equation 2:

$$N_s = 2^{56000/8000} = 128 \qquad \text{EQ. 2}$$

Thus, the 128 most robust codewords of the 256 available PCM codewords are chosen for transmission as part of the V.90 standard.

The V.90 Recommendation, therefore, provides a framework for transmitting data at rates up to 56 kbps provided the connection is capable of supporting the PCM transmission mode. The most notable requirement is that there can be at most one digital-to-analog conversion and no 8-bit PCM analog-to-digital conversion in the downstream path in the network. Nevertheless, other digital impairments, such as robbed bit signaling (RBS), digital mapping through attenuation pads (PAD), which results in attenuated signals, and code conversion between different PCM coding laws may also inhibit transmission at V.90 rates. Communication channels exhibiting non-linear frequency response characteristics are yet another impediment to transmission at the V.90 rates. Moreover, these other factors may limit conventional V.90 performance to less than the 56 kbps theoretical data rate.

The server/digital modem may specify the maximum downstream (i.e., from the server/digital modem to the client/analog modem) transmission power using a predefined bit field in the $INFO_{0d}$ message. The $INFO_{0d}$ message is transmitted from the server/digital modem to the client/analog modem during phase two of a multi-phase startup procedure defined by the V.90 Recommendation.

The V.90 Recommendation further provides for the use of a digital impairment learning (DIL) signal, which is transmitted from the server/digital modem to the client/analog modem during phase three of the multi-phase startup procedure. The client/analog modem receives and analyzes the DIL signal to determine accurate estimates of the signal levels corresponding to transmitted PCM codes as well as to identify digital impairments. Moreover, the DIL signal is a programmable signal with the signal content being specified through use of a DIL descriptor. The DIL descriptor includes several fields that comprise a compact representation of the complete DIL signal. The client/analog modem fills in these fields and transmits the DIL descriptor to the digital/server modem, where the DIL signal is generated based on the specifications contained in the DIL descriptor.

The constellation of symbols requested by the client/analog modem for incorporation into the DIL signal should not exceed the maximum transmission power limit, which is specified in the $INFO_{0d}$ message. Telephone authorities in most countries impose a maximum transmit power level for the encoded analog content transmitted from the PSTN towards the subscriber. Hereafter, this maximum power level will be referred to as the power limit. For instance, the United States regulations are contained in Part 68 of the Federal Communications Commission (FCC) publications. In many countries, including the United States, Japan, and Canada, this power limit is currently set at −12 dBm0. Thus, a conventional V.90 client/analog modem receiver, which may be implemented through a fixed point DSP processor, may be designed to maximize the receiver's dynamic range based on the −12 dBm0 power limit. Telephone authorities, such as the Federal Communications Commission (FCC) in the United States, however, have discussed the possibility of increasing the maximum transmission power allowed at the output of the D/A converter in the central office up to −6 dBm0. If higher power limits are approved, then conventional V.90 client/analog modems may not be able to take advantage of the higher transmission power levels and the improved signal to noise ratios (SNRs) that may accompany such increased power levels because they may be designed for optimum performance at the −12 dBm0 transmission power limit.

Consequently, there exists a need for modems having improved receiver performance at higher transmission power levels.

SUMMARY OF THE INVENTION

It is an object of the present invention to provide modems that may have improved performance at higher transmission power levels.

It is another object of the present invention to provide modems that may operate at multiple power levels.

These and other objects, advantages, and features of the present invention may be provided by modems, methods, and computer program products for providing a dual power mode capability in which a maximum power limit is determined for a received signal and, based on that determination, at least one modem operational parameter is adjusted and/or a digital impairment learning (DIL) sequence may be selected. Beneficially, adjustments made to the operational parameters may allow a modem to operate in a high power mode to achieve a higher downstream data rate. The higher downstream data rate may be attributed to an improved SNR resulting from an increase in data transmission power. Moreover, the modem may also operate in a normal power mode where the operational parameters may be set to maximize the client modem receiver's dynamic range. By selecting the DIL sequence based on the power limit, a DIL signal containing symbols having power levels within the power limit may be selected.

In accordance with an aspect of the present invention, the power limit may be received in a message, such as a V.90 $INFO_{0d}$ message, from a remote modem.

In accordance with another aspect of the present invention, adjustments may be made to a plurality of operational parameters, including, but not limited to, an adaptation step size for one or more components including adaptive digital filters, a target power level for an automatic gain control (AGC) component, a retrain power threshold used by a remote retrain detection component, and one or more scaling factors applied to internal signals of the modem.

In accordance with yet another aspect of the present invention, the power limit may be classified as either high or normal and a long DIL sequence may be selected if the power limit is high.

In accordance with still another aspect of the present invention, the long DIL sequence may comprise a short DIL sequence section, a guard segment, and a high power section. The short DIL sequence section includes symbols having lower power levels while the high power section includes symbols having higher power levels. The guard segment advantageously may reduce the possibility of the high power section distorting the short DIL sequence section.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF THE PREFERRED EMBODIMENTS

Figure 1:
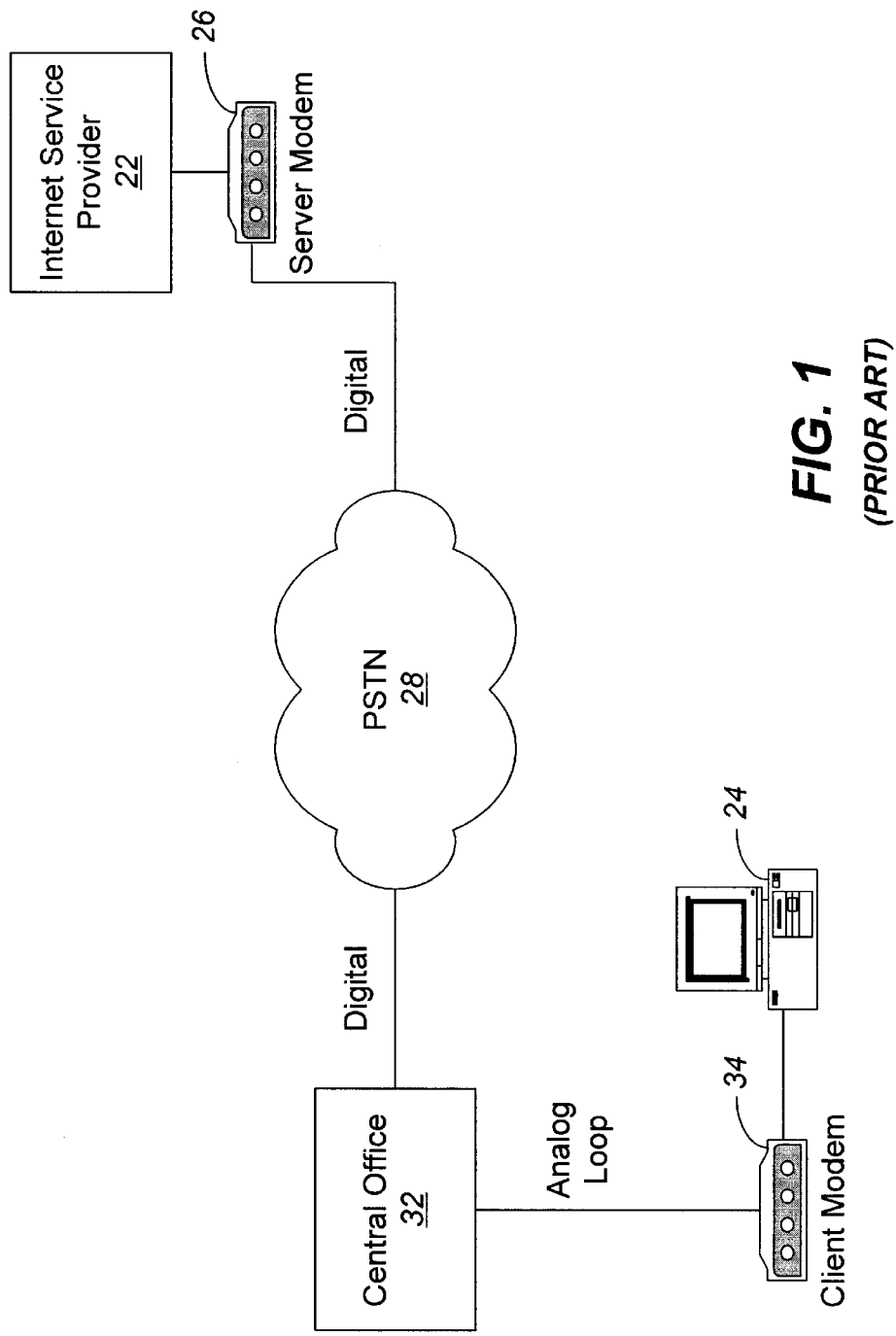
FIG. 1 is block diagram that illustrates a typical V.90 connection between a subscriber and an ISP in accordance with the prior art.
Figure 2:
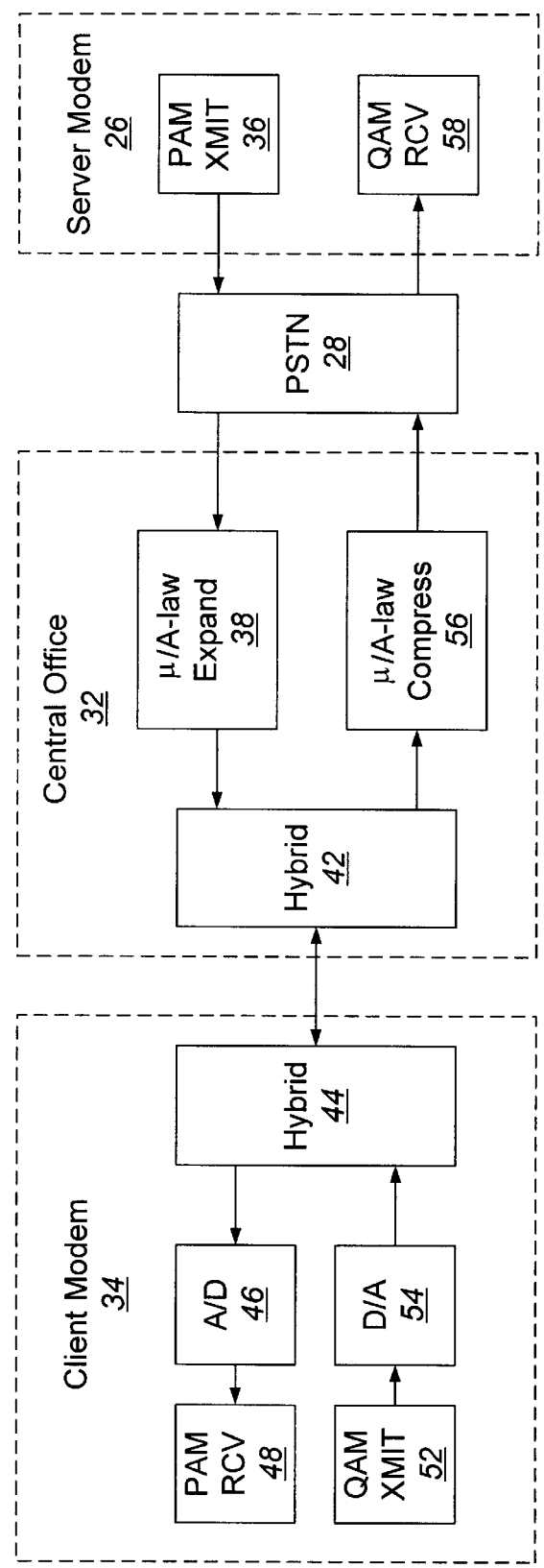
FIG. 2 is a block diagram that illustrates an internal architecture of a client modem, a central office, and a server modem shown in FIG. 1 and connections therebetween.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numbers signify like elements throughout the description of the figures.

The present invention may be embodied as a modem, a method, or a computer program product for providing a dual power mode capability. Accordingly, the present invention may take the form of an entirely hardware embodiment, an entirely software (including firmware, resident software, micro-code, etc.) embodiment, or an embodiment containing both software and hardware aspects. Furthermore, the present invention may take the form of a computer program product on a computer-usable or computer-readable storage medium having computer-usable program code means embodied in the medium for use by or in connection with an instruction execution system. In the context of this document, a computer-usable or computer-readable medium may be any means that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted or otherwise processed in a suitable manner if necessary, and then stored in a computer memory.

Computer program code for carrying out operations of the present invention may be written in a high level programming language such as C or C++. Some modules or routines, however, may be written in assembly language, machine language, or micro-code to optimize speed, memory usage, or layout of the software or firmware in memory. In a preferred embodiment, the present invention uses microcode to implement most software programs.

For purposes of illustration and in no way limited thereto, exemplary dual power mode modems, methods, and computer program products are discussed herein in the context of a V.90 modem application. It should be understood, however, that the principles and concepts of the present invention may be used in alternative modem types, such as a V.34 modem, or alternative communication devices incorporating receivers.

Dual Power Mode Modem System Architecture

Figure 3:
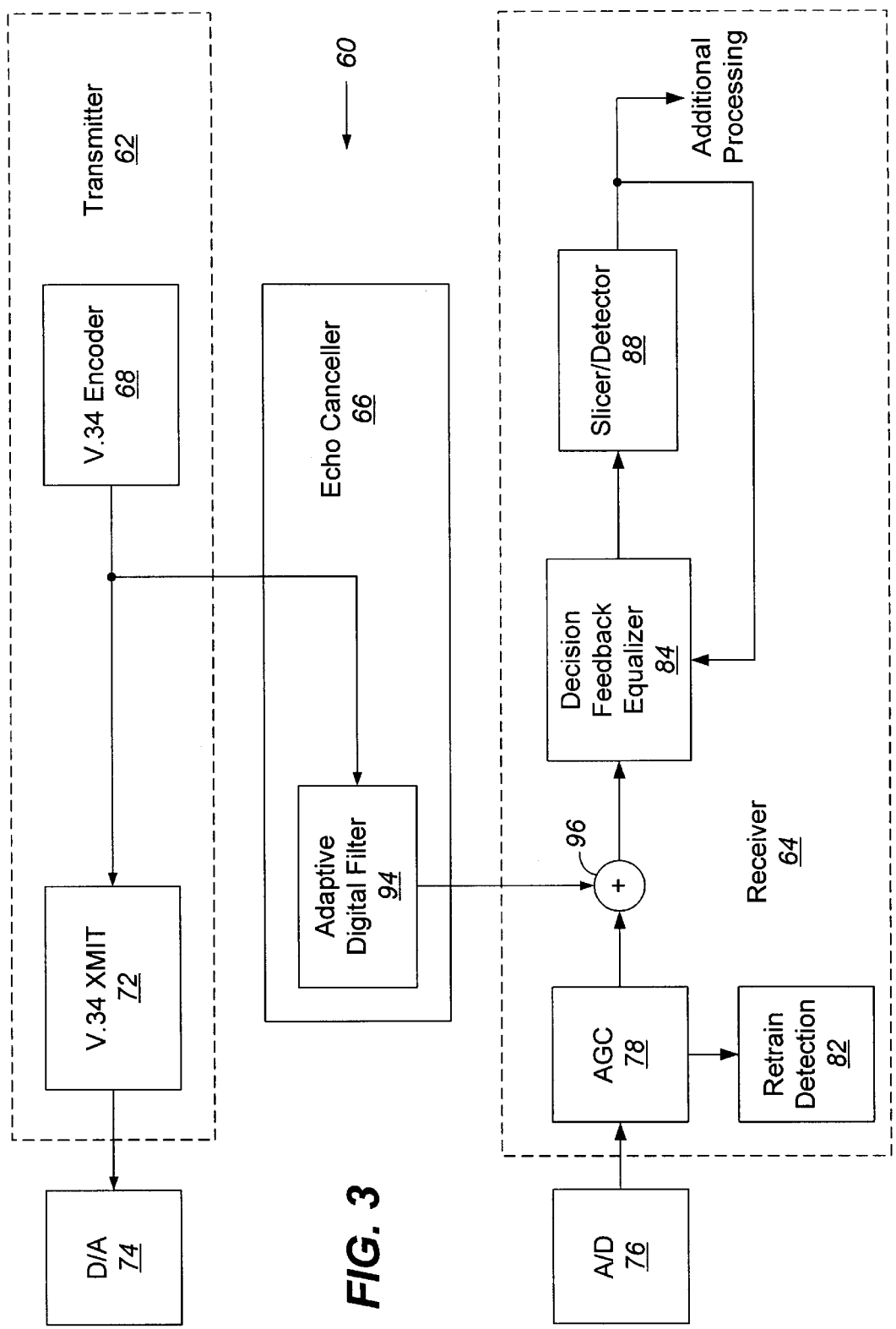
FIG. 3 is a block diagram that illustrates an exemplary V.90 client modem having a dual power mode capability in accordance with the present invention.

A block diagram of an exemplary V.90 client/analog modem 60 having a dual power mode capability in accordance with the present invention is shown in FIG. 3. The V.90 client/analog modem 60 includes a V.34 transmitter 62 and a PAM receiver 64, which are coupled together by an echo canceller 66. The transmitter 62 includes a V.34 encoder 68 that encodes the data to be transferred, typically using trellis coding, and then provides the encoded data to a V.34 transmit unit 72. The V.34 transmit unit 72 in conjunction with the D/A converter 74 transmits the encoded data towards the network using, for example, QAM modulation.

The receiver 64 receives a PAM signal from the network through an A/D converter 76. The digital samples from the A/D converter 76 are applied to an automatic gain control (AGC) component 78, which applies the amount of gain that may be needed to compensate for attenuation in the network and/or in the local loop. In accordance with the V.90 Recommendation, a retrain may be requested by the server/digital modem by transmitting silence to the client/analog modem 60. A retrain detection component 82 monitors the target power level the AGC component 78 to determine whether a retrain of the receiver 64 should be initiated.

Once the digitized signal has been amplified by the AGC component 78, the signal is received by an adaptive fractionally spaced decision feedback equalizer (DFE) 84. After the digitized signal is filtered by the decision feedback equalizer 84, the signal is received by the slicer/detector 88, which converts the digital samples into indices by comparing the digital samples with thresholds that are half-way between indexed reference signal levels comprising the PAM signaling alphabet. These indices may then be processed further to reconstruct the original data stream that a remote system has transmitted to the subscriber or client. The indices may also be fed back to the decision feedback equalizer (DFE) 84 for use in maintaining the decision feedback equalizer 84 filter coefficients. More specifically, the receiver 64 generates a mean squared error (MSE) signal, which is defined as the difference between the signal output from the decision feedback equalizer (DFE) 84 and the detected signal (i.e., indices) as determined by the slicer/detector 88. The MSE may be used to adapt the coefficients of the decision feedback equalizer 84 to the characteristics of the communication channel or medium.

When the V.34 signal transmitted by transmitter 62 is received by the line termination equipment in the central office, portions of this signal may reflect back towards the V.90 client/analog modem 60, thereby creating a disturbing echo signal superimposed on the incoming PAM signals. The echo canceller 66 is used to filter out this echo signal so that it does not interfere with the performance of the receiver 64. More specifically, the echo canceller 66 receives a complex T-spaced symbol stream from the V.34 encoder 68 and produces a real, T/k fractionally spaced symbol stream as an output, where k is an integer number and T refers to the modulation interval, which is generally given by the inverse of the symbol (baud) or sample rate. Selection of the integer k depends on the sampling rate used by the front end of the receiver 64 (i.e., the A/D converter 76 and the AGC 78). The echo canceller 66 in accordance with the present invention comprises an adaptive digital filter 94 that performs both an interpolation function as well as a filtering function. The sampling rate used in the V.34 encoder 68 is typically different from the sampling rate used by the front end of the receiver 64. In a preferred embodiment, the V.34 encoder 68 operates at 3200 samples per second while the digital samples from the AGC 78 are output at 9600 samples per second. Thus, the adaptive digital filter 94 is used to match the sampling rate of the transmitter 62 with the sampling rate of the receiver 64 by interpolating the samples from the V.34 encoder 68 up to the 9600 samples per second rate. To achieve this level of interpolation, k is typically set to three in a preferred embodiment. Note that because the transmitter 62 and the receiver 64 share the same local clock, the echo canceller 66 need not perform a clock synchronization function in addition to the interpolation.

The adaptive digital filter 94 may be implemented as a finite impulse response (FIR) filter comprising a tapped delay line with associated tap coefficients. The output from the adaptive digital filter 94 is combined with the digitized signal from the AGC 78 in an adder 96. Desirably, the output from the adaptive digital filter 94 should complement the echo signal reflecting back from the local loop to effectively cancel its effect upon the received PAM signal. Because the symbols from the V.34 encoder 68 are generally encoded as complex values when QAM modulation is used, the tap coefficients for the adaptive digital filter 94 are designed to convert from the complex domain to the real domain as the digital samples representing the PAM signals in the receiver 64 are real values. Typically, the tap coefficients for the adaptive digital filter 94 are trained during a startup interval for the V.90 client/analog modem 60 in which test signals are transmitted from the transmitter 62 and the coefficients are adjusted until the output from the adder 96 is approximately null.

Figure 4:
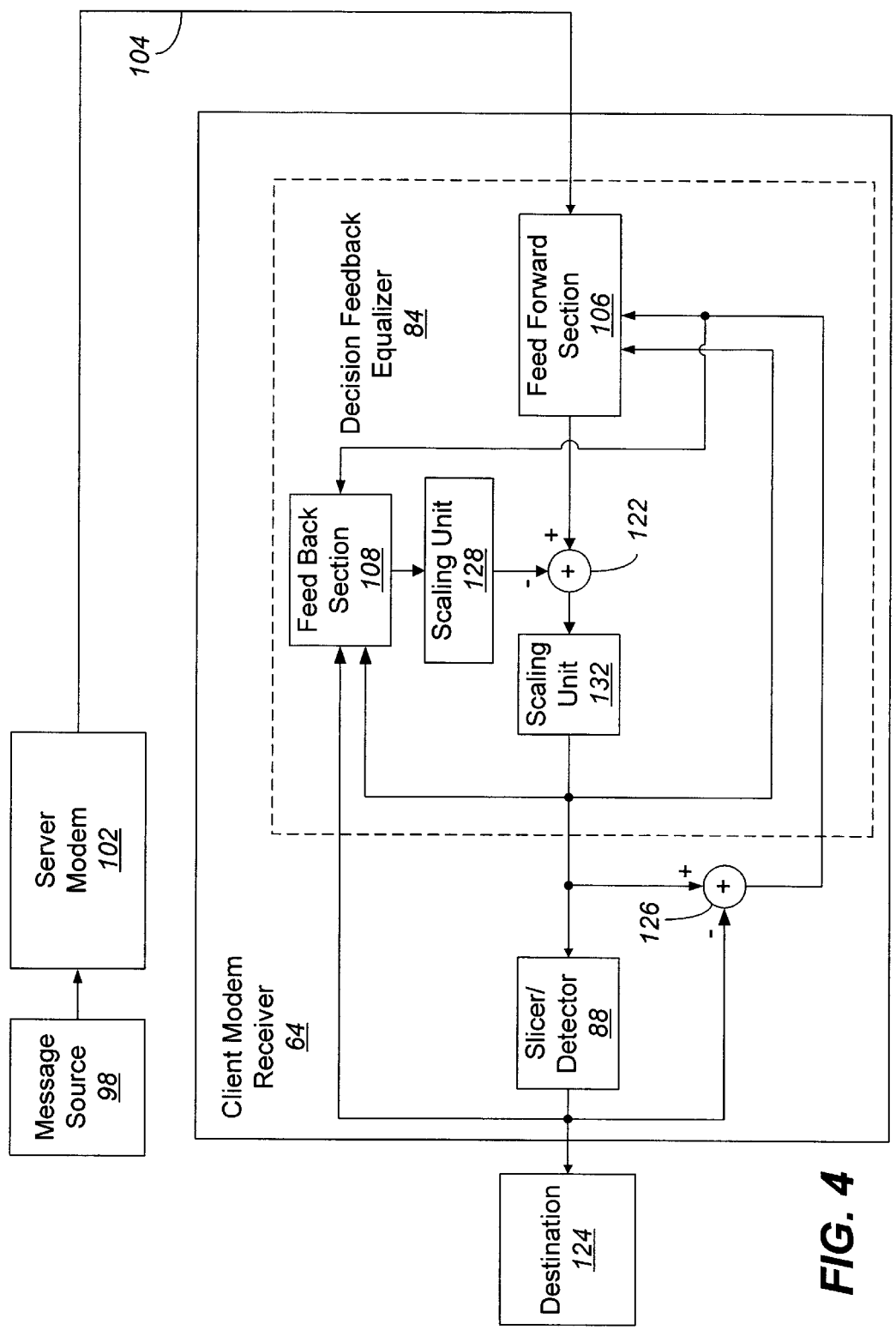
FIG. 4 is a block diagram of a receiver shown in FIG. 3 that illustrates dual power mode modems, methods, and computer program products in accordance with the present invention.

With reference now to FIG. 4, a preferred architecture of the receiver 64 will be described in greater detail. Information from a message source 98, such as an ISP, is transmitted via a V.90 server modem 102 through the PSTN 28 until reaching the local loop to which the client modem receiver 64 is connected. The connection through the PSTN 28, including the line card in the central office 32, the local loop, and the front end of the receiver 64 (including the echo cancellation performed by the echo canceller 66 and the adder 96), are represented by the communication path 104 in FIG. 4.

An interpolator (not shown) may be used in conjunction with the decision feedback equalizer 84 to match the sampling rate of the receiver 64 with the sampling rate of the network, which is 8000 samples per second. In a preferred embodiment, the sampling rate used by the A/D converter 76 and the AGC 78 is 9600 samples per second. The decision feedback equalizer 84 comprises a feed forward section 106 and a feed back section 108 and typically provides some level of interpolation or decimation to the sampling rate. For example, in a preferred embodiment of the present invention, the feed forward section 106 receives input samples with a sampling interval of T/q and filters these input samples through use of a tapped delay line having a tap spacing of pT/q. Recall that T corresponds to the modulation interval, which is 1/8000 samples per second (i.e., the network sampling rate). The specific choice of values for p and q is generally based on a compromise between computational complexity, storage requirements, and bandwidth availability. In a preferred embodiment, p and q are set to three and four respectively; therefore, the digital samples are interpolated from 9600 samples per second up to 32000 samples per second. Then, once the samples are decimated by the decision feedback equalizer 84, the digital samples are provided to the slicer/detector 88 at the network sampling rate of 8000 samples per second.

Figure 5:
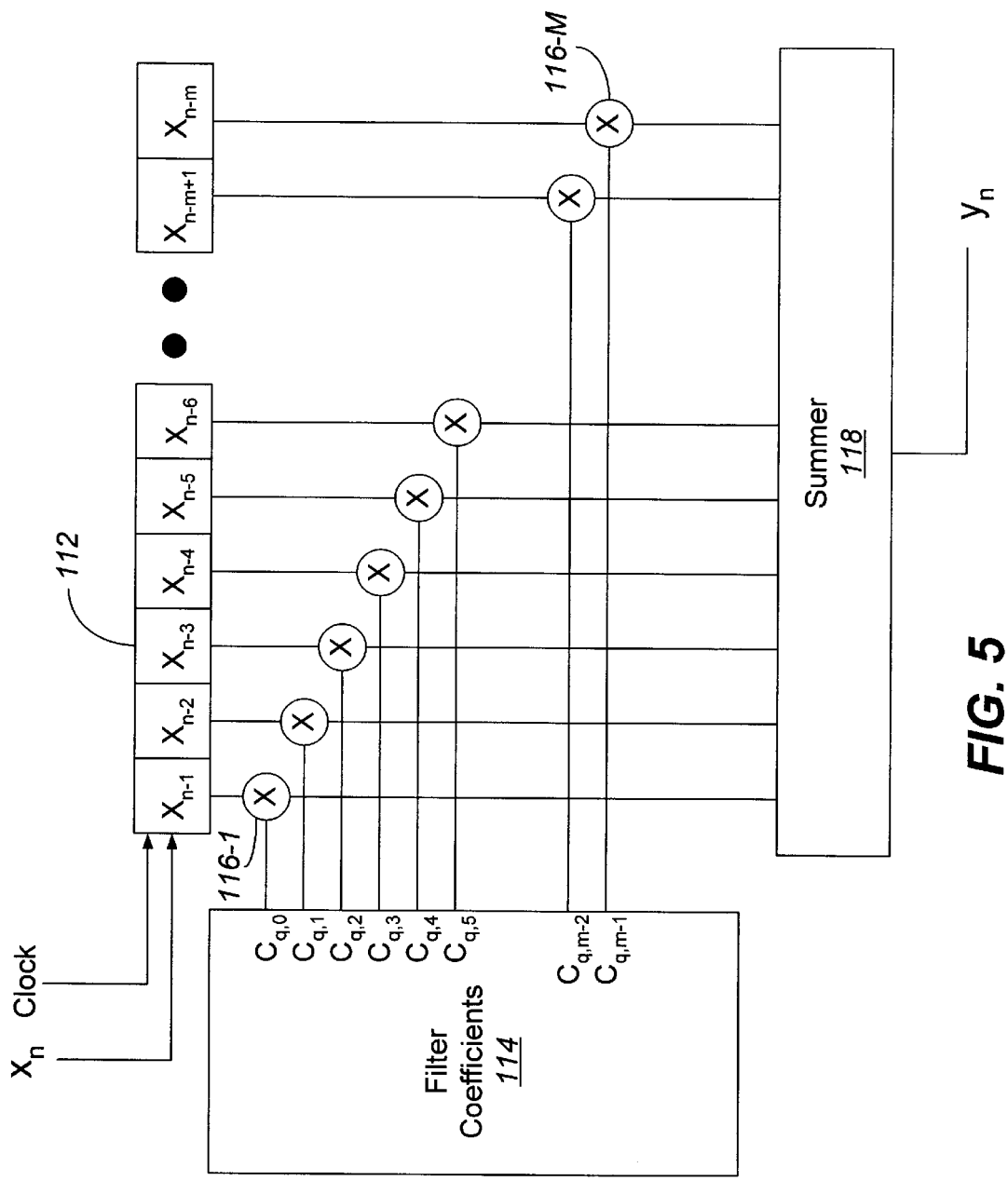
FIG. 5 is a block diagram that illustrates an adaptive digital filter that may be used in an adaptive fractionally spaced decision feedback equalizer and echo canceller shown in FIGS. 3 and 4.

FIG. 5 shows the general structure of an adaptive FIR filter, which is a preferred implementation for the feed forward section 106, the feed back section 108, and the adaptive digital filter 94 (see FIG. 3) used in the echo canceller 66. The operation of an FIR digital filter can generally be represented by Equation 3 set forth below:

$$Y_n = \sum_{k=1}^{k=m} C_k^n X_{n-k}$$ EQ. 3 where $Y_n$ is the output at time n, $C_k^n$ is the $k^{th}$ coefficient at time n and $X_{n-k}$ is the input at time n-k. Typically, the collection of samples $X_{n-1}$ through $X_{n-m}$ are stored in a tapped delay line 112. The characteristics of the filter are determined by the values of the coefficients 114 at time n. Each coefficient is also called a tap weight or tap coefficient. Each coefficient, $C_k^n$ is used to multiply the respective sample of X(t) through a corresponding multiplier 116-i with the result that $Y_n$ is equal to the sum of the products of the coefficients and the respective m samples of X(t), which is output from a summer 118. This approach of generating output samples $Y_n$ based on a weighted summation of prior-in-time input samples combats the effects of attenuation, and inter-symbol interference (ISI) due to delay and distortion caused by the equivalent channel 104.

Returning to FIG. 4, the feed forward section 106 is used to filter the digital samples to counteract the effects of channel amplitude and phase distortion due to the equivalent channel 104. These filtered samples are then applied to the slicer/detector 88 through an adder 122. The slicer/detector 88 converts the digital samples from the output of the adder 122 to indices by comparing the samples with a PAM signaling alphabet comprising indexed reference signal levels. These indices are decoded into a stream of digital data that correspond to the original data sent from the message source 98. Ultimately, this stream of digital data is provided to the destination 124. The slicer/detector 88 also outputs the reference signal levels corresponding to these indices. This second output of the slicer/detector 88 is provided to the feed back section 108 and an adder 126.

A first feedback loop is formed through the adder 126 for computing the MSE signal, which is defined as the difference between the received signal at the input of the slicer/detector 88 and the detected signal as determined by the slicer/detector 88. This error signal is used to adapt the coefficients of the feed forward section 106 and the feed back section 108 to the characteristics of the equivalent channel 104. A second feedback loop is included that couples the output of the slicer/detector 88 through the feed back section 108 to the adder 122. The feed back section 108 is used to further refine the digital samples that are applied to the slicer/detector 88. Specifically, the signal samples input to the feed back section 108 are reference signal levels from the slicer/detector 88 and are thus uncorrupted by noise as long as the slicer/detector 88 is correctly estimating or detecting the transmitted PAM symbols. Therefore, the feed back section 108 is designed primarily to reduce the effects of ISI due to the delay characteristics of the equivalent channel 104.

The decision feedback equalizer 84 further includes a scaling unit 128 that couples the output of the feed back section 108 to the adder 122 and a scaling unit 132 that couples the output of the adder 122 to the slicer/detector 88. These two scaling units 128 and 132 may be used to scale the signals output from the feed back section 108 and the adder 122, respectively, based on the maximum transmission power level allowed for the downstream signal (i.e., the signal transmitted from the central office to the client/analog modem 60).

The receiver structure described hereinabove lends itself to an efficient implementation requiring approximately eighteen million instructions per second (MIPS) in a typical digital signal processor. Moreover, the receiver structure is compatible with existing analog front ends and transmitters designed for the V.34 or other comparable legacy recommendation standards.

Dual Power Mode Modem Software Architecture

Figure 6:
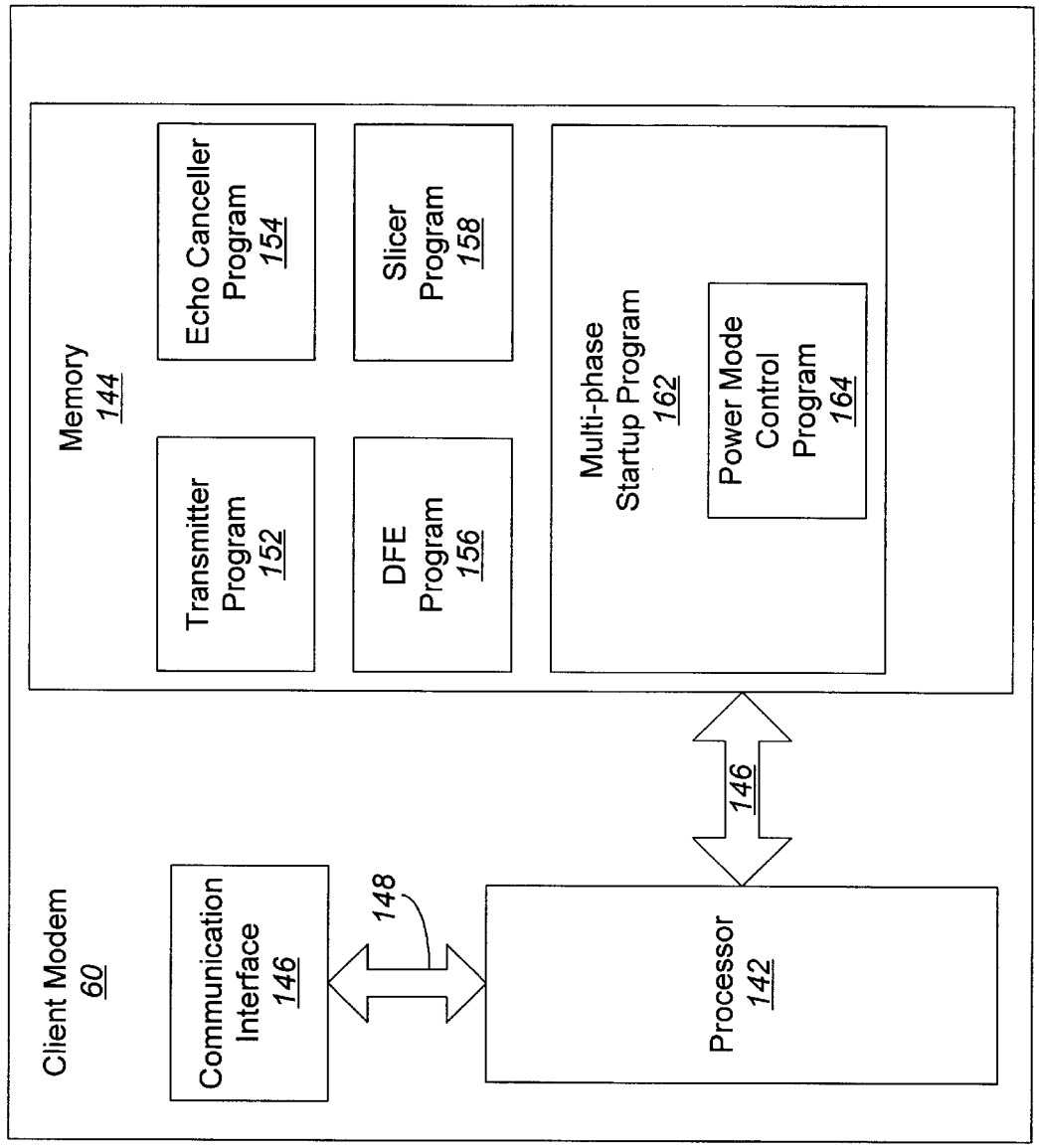
FIG. 6 is a block diagram that illustrates an exemplary software architecture for dual power mode modems of FIGS. 3 and 4.

Referring now to FIG. 6, a software architecture for the exemplary V.90 client/analog modem 60 having a dual power mode capability in accordance with the present invention will be described. The client/analog modem 60 includes a processor 142, preferably a digital signal processor, which communicates with a memory 144 via an address/data bus 146. In addition, the processor 142 may receive and transmit information to external devices via a communication interface 146, which is accessed through an input/output (I/O) bus 148. The processor 142 may be any commercially available or custom processor suitable for a real-time intensive embedded application. The memory 144 is representative of the overall hierarchy of memory devices containing the software and data used to implement the functionality of the V.90 client/analog modem 60. The memory 144 may include, but is not limited to, the following types of devices: cache, ROM, PROM, EPROM, EEPROM, flash, SRAM, and DRAM.

As shown in FIG. 6, the memory 144 includes program modules for implementing the functionality of the components discussed in the foregoing with reference to FIGS. 3 and 4. That is, the memory 144 includes a transmitter program module 152, an echo canceller program module 154, a decision feedback equalizer (DFE) program module 156, and a slicer program module 158. Each of these program modules corresponds to a respective component of the dual power mode, V.90 client/analog modem 60 shown in FIG. 3.

In addition, the memory 144 further includes a multi-phase startup program module 162, which comprises a power mode control program module 164. The multi-phase startup program module 162 may be used to implement the multi-phase startup protocol defined in the V.90 Recommendation. The power mode control program module 164 may be used to determine the maximum downstream transmission power in use for a communication session and to adjust certain operational parameters of the client/analog modem 60 based on that determination.

The present invention is described herein with reference to flowchart and/or block diagram illustrations of methods, apparatus (systems), and computer program products according to an embodiment of the invention. It will be understood that each block of the flowchart and/or block diagram illustrations, and combinations of blocks in the flowchart and/or block diagram illustrations, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions specified in the flowchart and/or block diagram block or blocks.

These computer program instructions may also be stored in a computer-usable or computer-readable memory that can direct a computer or other programmable data processing apparatus to function in a particular manner, such that the instructions stored in the computer-usable or computer-readable memory produce an article of manufacture including instruction means that implement the function specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart and/or block diagram block or blocks.

Operations and features provided by the exemplary V.90 client/analog modem 60 having a dual power mode capability will be described hereafter with reference to the flow charts of FIGS. 7–8 and the architectural diagrams of FIGS. 3, 4, and 6.

Dual Power Mode Control

The client/analog modem 60 may, in accordance with the present invention, have two operational modes: a "high" power mode and a "normal" power mode. Depending on the operating mode of the client/analog modem 60, one or more operational parameters may be adjusted to alter the dynamic range of the client modem receiver 64.

Figure 7:
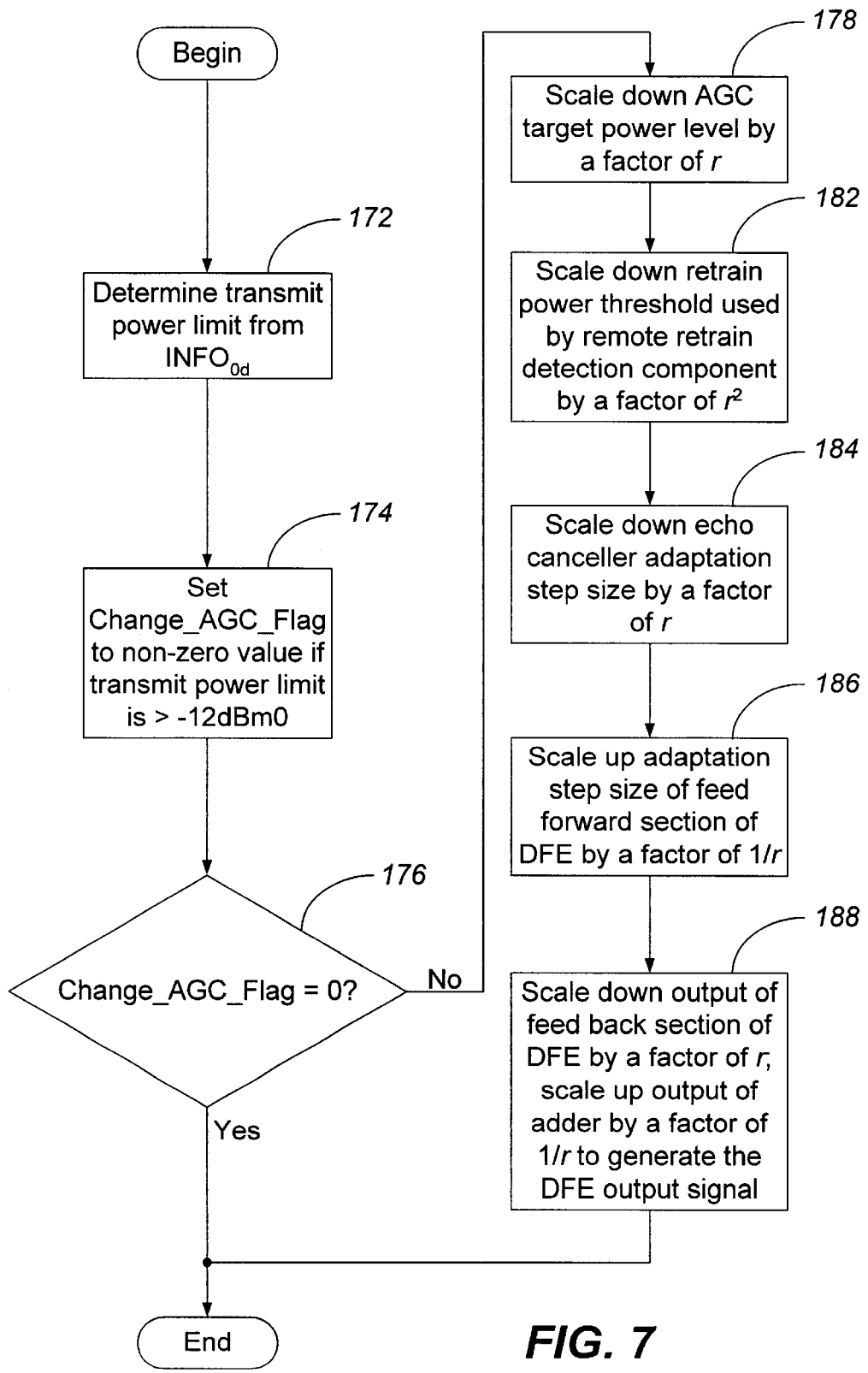
FIG. 7 is a flow chart that illustrates exemplary operations of dual power mode modems of FIGS. 3, 4, and 6 for adjusting operational parameters in accordance with aspects of the present invention.

Referring now to FIGS. 6 and 7, operations for adjusting operational parameters begin at block 172 where the power limit for a received signal is determined by the power mode control program module 164. In accordance with the V.90 Recommendation, a server/digital modem may use five bits in the $INFO_{od}$ message to specify the maximum downstream transmission power to be used for a communication session. The $INFO_{0d}$ message is then transmitted to the client/analog modem 60 during phase two of a multi-phase startup procedure defined by the V.90 Recommendation.

As discussed hereinbefore, the telephone authorities in many countries specify a power limit of −12 dBm0. Nevertheless, discussions have been held regarding the possibility of increasing the power limit to −6 dBm0. Thus, the power mode control program module 164 translates the power limit specified in the $INFO_{0d}$ message into dBm0 format and, at block 174, sets a flag, called Change_AGC_Flag in a preferred embodiment, to a non-zero value if the power limit is >31 12 dBm0. The flag Change_AGC_Flag provides a classification for the power limit as either "high" or "normal." That is, if the Change_AGC_Flag is set to a non-zero value, then the power limit is high and the client/analog modem 60 will enter a high power mode. Conversely, if the Change_AGC_Flag is set to zero, then the power limit is normal and the client/analog modem 60 will enter a normal power mode.

When the multi-phase startup program 162 enters phase three of the startup procedure, the Change_AGC_Flag will be examined at block 176 to determine whether the client/analog modem should transition into high power mode or remain in normal power mode. If the Change_AGC_Flag is set to zero, then the power limit is normal and no adjustment need be performed to the operational parameters affecting the dynamic range of the client modem receiver 64 (see FIG. 4). Thus, the client/analog modem 60 may remain in normal power mode. If, however, the Change_AGC_Flag is non-zero, then certain operational parameters affecting the dynamic range of the client modem receiver 64 may be adjusted by the power mode control program module 164. In this case, the client/analog modem 60 transitions into high power mode and operations continue at block 178 where the target power level of the AGC component 78 (see FIG. 3) (i.e., the short-time averaged power level at the output of the AGC component 78) is scaled down by a factor of r. That is, the AGC target power level is reduced by setting it to a factor r times the value used in normal power mode, where r is a positive number less than one. This adjustment is made to reduce the possibility that the client modem receiver 64 circuitry may overflow due to the increased power limit.

In a preferred embodiment of the present invention, the retrain detection component 82 (see FIG. 3) monitors the target power level of the AGC component 78 to determine whether a retrain of the client modem receiver 64 should be initiated. Because the AGC target power level has been scaled down at block 178, a retrain power threshold used by the retrain detection component 82 is, correspondingly, scaled down by a factor of $r^2$ at block 182.

The MSE, which is defined as the difference between the signal output from the decision feedback equalizer (DFE) 84 and the detected signal (i.e., indices) as determined by the slicer/detector 88, may be used to adapt the filter coefficients of the decision feedback equalizer 84. A separate error signal, which is defined as the difference between an estimated echo and the actual echo signal, may be used to train the echo canceller 66 (see FIGS. 3 and 4). In a preferred embodiment of the present invention, the least mean squares (LMS) algorithm is used in the coefficient adaptation processed. In the LMS algorithm, the MSE is multiplied by a constant called the adaptation step size. At block 184, the adaptation step size used to adapt the filter coefficients associated with the echo canceller 66 is scaled down by a factor of r because the target echo level is two times smaller due to the reduction in the target power level of the AGC component 78. As a result, there may be no difference between the echo canceller's 66 convergence speed and coefficient scaling between the normal and high power modes.

The adaptation step size of the feed forward section 106 of the decision feedback equalizer 84 is scaled up by a factor of 1/r at block 186 because the AGC target power level has been scaled down at block 178 resulting in a more attenuated input signal. Again, the adaptation step size scaling may allow the convergence speed and coefficient scaling for the feed forward section 106 to remain the same between the normal and high power modes.

A scaling factor applied by the scaling unit 128 (see FIG. 4) is set at block 188 to r so that the output signal from the feed back section 108 is scaled down by a factor of r. The scaling factor applied by the scaling unit 128 is preferably set to match the increased attenuation applied to the input signal of the decision feedback equalizer 84 due to the reduction in the target power level of the AGC component 78. The scaling factor applied by the scaling unit 132 is set at block 188 to 1/r so that the output signal from the adder 122 is scaled up by a factor of 1/r. The scaling factor applied by the scaling unit 132 is preferably set to match the inverse of the increased attenuation applied to the input signal of the decision feedback equalizer 84 due to the reduction in the target power level of the AGC component 78. For the feed back section 108, inasmuch as there is no change in the output from the slicer/detector 88 nor in scaling of the MSE generated by adder 126, its convergence speed and coefficient scaling are unchanged in the normal and high power modes.

It should be understood that the adjustments made to the foregoing operational parameters are based on a preferred embodiment in which r is set to ½ corresponding to an increase in the power limit from −12 dBm0 to −6 dBm0. Alternative adjustments may be made for different values of the power limit. Moreover, the operational parameters selected for adjustment are based on a preferred embodiment of the client modem receiver 64. Alternative operational parameters may be selected for adjustment based on other receiver embodiments. These operational parameters may comprise one or more of the operational parameters discussed herein or may comprise other operational parameters that affect the dynamic range of the particular receiver architecture.

Beneficially, the adjustments made to the operational parameters may allow the client/analog modem 60 to operate in a high power mode to achieve a higher downstream data rate. The higher downstream data rate may be attributed to an improved SNR resulting from the increase in data transmission power. Moreover, the client/analog modem 60 may also operate in a normal power mode where the operational parameters may be set to maximize the client modem receiver's 64 dynamic range.

In addition to adjusting operational parameters based on the operating mode (i.e., high power or normal power) of the client/analog modem 60, a digital impairment learning (DIL) sequence may also be selected in accordance with the operating mode.

Figure 8:
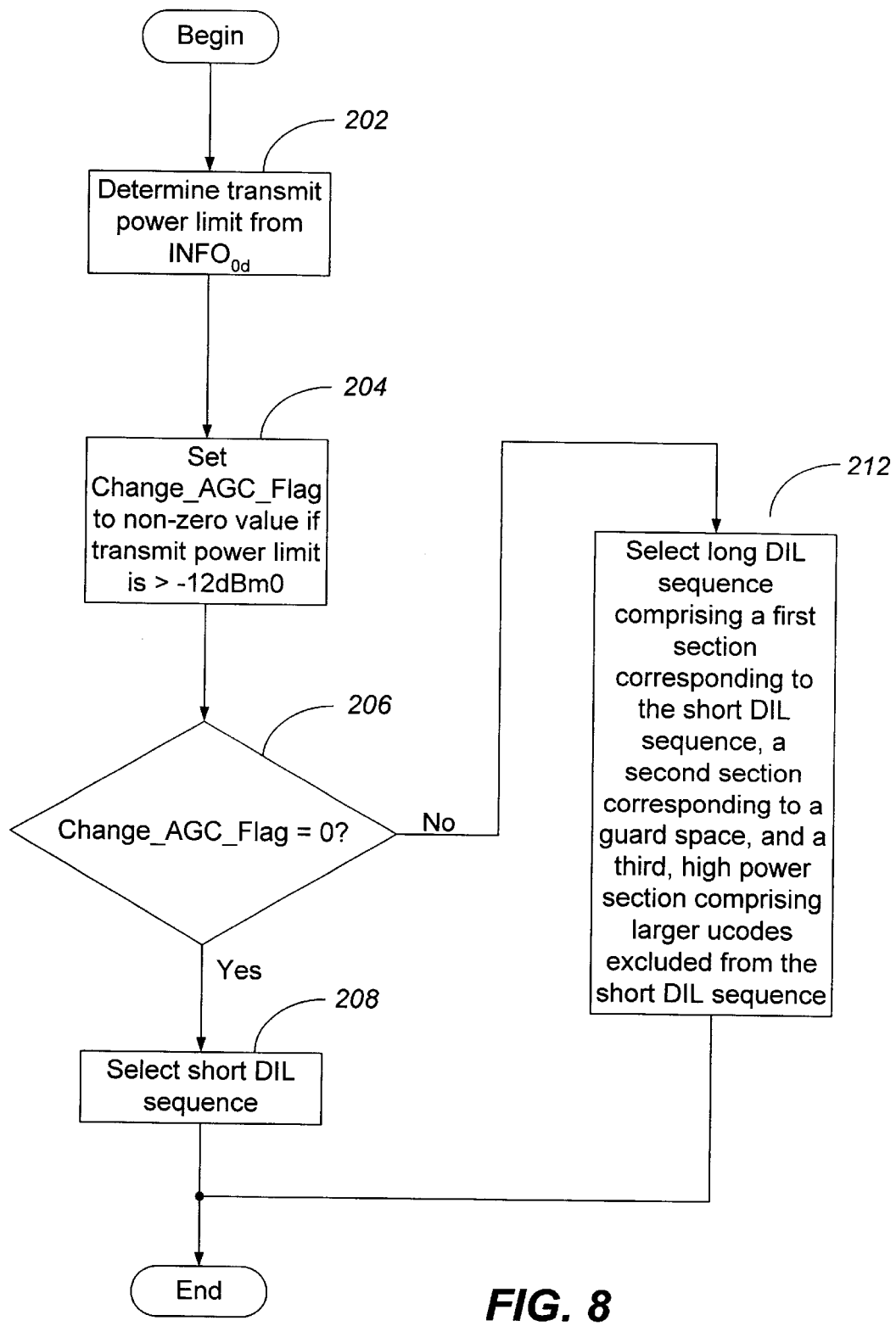
FIG. 8 is a flow chart that illustrates exemplary operations of dual power mode modems of FIGS. 3, 4, and 6 for generating a digital impairment learning (DIL) sequence in accordance with aspects of the present invention.

Referring now to FIG. 8, operations for generating a DIL sequence begin at block 202 where the operation mode for the client/analog modem 60 is determined at blocks 202, 204, and 206 as discussed hereinbefore with respect to blocks 172, 174, and 176 of FIG. 7. Thus, if the analog/client modem 60 remains in normal power mode based on the determination at block 206, then the power mode control program 164 selects a short DIL sequence at block 208.

A DIL sequence may comprise a sequence of symbols, which, in a V.90 modem, may be called Ucodes. Through use of the term "Ucode" the V.90 Recommendation allows PCM codes to be identified in a manner that is independent of the coding law used (i.e., $\mu$-law or A-law). There are 128 Ucodes ranging from 0 to 127, where Ucode 0 corresponds to the smallest possible signal amplitude and Ucode 127 corresponds to the largest possible signal amplitude. For a particular coding law, a Ucode together with a sign bit fully specifies the transmitted PCM code.

In accordance with the present invention, the short DIL sequence is generated by excluding those Ucodes corresponding to the highest power levels. In a preferred embodiment, the short DIL sequence comprises Ucodes 0 through 110. By using the short DIL sequence in normal power mode, the time to complete the startup procedure may be slightly shorter and there may potentially be fewer inter-working problems with a server/digital modem. That is, some server/digital modems may timeout before all 128 Ucodes, or some alternative number of Ucodes greater than 110, could be transmitted in the DIL sequence. It should be understood that fewer or more Ucodes may be included in alternative embodiments of the present invention based on such factors as the power limit, digital impairments in the network, such as PADs, and capabilities of the digital/server modem.

If the analog/client modem 60 transitions into high power mode based on the determination at block 206, then the power mode control program 164 selects a long DIL sequence at block 212. The long DIL sequence comprises a first segment corresponding to the short DIL sequence discussed in the foregoing, a second segment corresponding to a guard or near-silence space, and then a third or high power section comprising larger Ucodes excluded from the short DIL sequence. In a preferred embodiment, the high power section comprises Ucodes 111 through 120. It should be understood that fewer or more Ucodes may be included in both the short DIL sequence and the high power section in alternative embodiments of the present invention based on such factors as the power limit, digital impairments in the network, such as PADs, and capabilities of the digital/server modem. As discussed hereinabove, a server/digital modem may timeout before completing longer DIL sequences. Thus, the long DIL sequence should only be selected with those server/digital modems having a capability to transmit longer DIL sequences. Preferably, the power mode control program module provides the DIL learning algorithm with the operating mode of the client/analog modem 60 so the DIL learning algorithm may know whether to expect the short DIL sequence or the long DIL sequence.

Non-linear distortion may be described as an amplitude dependent, non-linear signal characteristic. Even a modest amount of non-linear distortion may reduce the maximum achievable data rate in a V.90 modem to under 40 kbps and often to just slightly faster than 30 kbps. Moreover, the problem of non-linear distortion may be further aggravated by the power level of the incoming signal from the central office. Thus, the Ucodes transmitted in the high power section may result in an increase in non-linear distortion. These Ucodes are generally only needed to overcome the affects of a digital attenuation PAD or PADs in the network, in which case, non-linear distortion at the D/A converter in the central office may be less likely to occur. If no PAD is present, then the Ucode levels in the high power section will typically not be selected by the constellation generation algorithm for the client/analog modem 60. It should also be noted that "spill over" of non-linear distortion that may be caused by the high power section is isolated from the short DIL sequence section by the guard/near-silence space segment.

It is envisioned that a non-linear distortion measurement algorithm may be used to measure the non-linear distortion level for the DIL sequence in general and the high power section in particular. If the non-linear distortion level is determined to be above a certain threshold for certain high Ucodes, then these Ucodes may be excluded from the constellation generation algorithm by setting their learned DIL levels to zero. In this case, the actual transmission power of the resulting constellation may be less than that allowed by the power limit specified in the INFO$_{od}$ message because of the exclusion of those higher power Ucodes that may exacerbate the non-linear distortion.

The flow charts of FIGS. 7 and 8 illustrate the architecture, functionality, and operations of a possible implementation of the V.90 client/analog modem 60 software. In this regard, each block represents a module, segment, or portion of code, which comprises one or more executable instructions for implementing the specified logical function(s). It should also be noted that in some alternative implementations, the functions noted in the blocks may occur out of the order noted in the figures. For example, two blocks shown in succession may in fact be executed substantially concurrently or the blocks may sometimes be executed in the reverse order, depending upon the functionality involved.

While the present invention has been illustrated and described in detail in the drawings and foregoing description, it is understood that the embodiments shown are merely exemplary. Moreover, it is understood that many variations and modifications can be made to the embodiments described hereinabove without substantially departing from the principles of the present invention. All such variations and modifications are intended to be included herein within the scope of the present invention, as set forth in the following claims.

We claim:

1. A dual power mode modem, comprising:
   means for determining a power limit for a received signal;
   an adjustable automatic gain control (AGC) component that is responsive to the means for determining the power limit;
   an adjustable remote retrain detection component coupled to the AGC component and being responsive thereto;
   an adjustable decision feedback equalizer (DFE) that is responsive to the AGC component and the means for determining the maximum power limit, comprising:
     a feed forward section that generates a feed forward output signal;
     a feed back section that generates a feed back output signal;
     an adder that subtracts the feed back output signal from the feed forward output signal to generate an adder output signal;
     a first adjustable scaling unit that couples the feed back output signal to the adder and applies a first, adjustable scaling factor thereto;
     a second adjustable scaling unit that applies a second, adjustable scaling factor to the adder output signal; and
   an adaptive echo canceller coupled to the adjustable DFE and being responsive to the means for determining the power limit.

2. A dual power mode modem as recited in claim 1, further comprising:
   means for adjusting a plurality of operational parameters for the modem based on the power limit.

3. A dual power mode modem as recited in claim 2, wherein the plurality of operational parameters comprise:
   a target power level of the adjustable AGC component;
   a retrain power threshold used by the adjustable remote retrain detection component;
   an adaptation step size used to adapt filter coefficients associated with the adaptive echo canceller; and
   an adaptation step size used to adapt filter coefficients associated with the feed forward section.

4. A dual power mode modem as recited in claim 3, further comprising:
   means for scaling the target power level of the adjustable AGC component;
   means for scaling the retrain power threshold;
   means for scaling the adaptation step size used to adapt filter coefficients associated with the adaptive echo canceller;
   means for scaling the adaptation step size used to adapt filter coefficients associated with the feed forward section;
   means for setting the first scaling factor to a first value; and
   means for setting the second scaling factor to a second value.

5. A dual power mode modem, comprising:
   means for determining a power limit for a received signal;
   an adaptive digital filter; and
   means for adjusting at least one operational parameter for the modem based on the power limit;
   wherein the at least one operational parameter comprises an adaptation step size used to adapt coefficients associated with the adaptive digital filter.

6. A dual power mode modem as recited in claim 5, wherein the means for determining the power limit comprises:
   means for receiving a message from a remote modem that contains the power limit.

7. A dual power mode modem as recited in claim 5, further comprising:
   an automatic gain control (AGC) component; and
   wherein the at least one operational parameter comprises a target power level of the AGC component.

8. A dual power mode modem as recited in claim 7, further comprising:
   a remote retrain detection component coupled to the AGC component; and
   wherein the at least one operational parameter comprises a retrain power threshold used by the remote retrain detection component.

9. A dual power mode modem as recited in claim 5, wherein the at least one operational parameter comprises at least one scaling factor applied to an internal signal of the modem.

10. A dual power mode modern as recited in claim 5, wherein the means for adjusting at least one operational parameter comprises:
    means for adjusting a plurality of operational parameters for the modem based on the power limit.

11. A dual power mode modem, comprising:
    means for determining a power limit for a received signal;
    means for classifying the power limit as one of high and normal;
    means for selecting a digital impairment learning (DIL) sequence based on the power limit comprising means for selecting a long DIL sequence if the power limit is high.

12. A dual power mode modem as recited in claim 11, wherein the means for determining the power limit comprises:
    means for receiving a message from a remote modem that contains the power limit.

13. A dual power mode modem as recited in claim 11, wherein the long DIL sequence comprises:
    a short DIL sequence section comprising a first subset of symbols selected from a plurality of symbols;
    a guard segment; and
    a high power section comprising a second subset of symbols selected from the plurality of symbols, each of the plurality of symbols having a power level associated therewith such that the power levels associated with the second subset of symbols are greater than the power levels associated with the first subset of symbols.

14. A dual power mode modem as recited in claim 13, wherein the means for selecting the DIL sequence comprises:

means for selecting the short DIL sequence if the power limit is normal.

15. A dual power anode modem as recited in claim 13, wherein the plurality of symbols comprises a plurality of Ucodes ranging from 0 to 127, the first subset of symbols comprises the Ucodes 0 through 110, and the second subset of symbols comprises the Ucodes 111 through 120.

16. A method of operating a dual power mode modem comprising an adaptive digital filters, comprising the steps of:

determining a power limit for a received signal; and adjusting at least one operational parameter for the modem based on the power limit wherein the at least one operational parameter comprises an adaptation step size used to adopt filter coefficients associated with the adaptive digital filter.

17. A method as recited in claim 16, wherein the step of determining the power limit comprises the step of:

receiving a message from a remote modem that contains the power limit.

18. A method as recited in claim 16, wherein the modem further comprises an automatic gain control (AGC) component and the at least one operational parameter comprises a target power level of the AGC component.

19. A method as recited in claim 18, wherein the modem further comprises a remote retrain detection component coupled to the AGC component and the at least one operational parameter comprises a retrain power threshold used by the remote retrain detection component.

20. A method as recited in claim 16, wherein the at least one operational parameter comprises at least one scaling factor applied to an internal signal of the modem.

21. A method as recited in claim 16, wherein the step of adjusting at least one operational parameter comprises the step of:

adjusting a plurality of operational parameters for the modem based on the power limit.

22. A method as recited in claim 21, wherein the modem comprises an automatic gain control (AGC) component, a remote retrain detection component, an echo canceller, a decision feedback equalizer (DFE) that includes a feed forward section that generates a feed forward output signal and a feed back section that generates a feed back output signal, an adder that subtracts the feed back output signal from the feed forward output signal to generate an adder output signal, a first scaling unit that couples the feed back output signal to the adder, a slicer, and a second scaling unit that couples the adder output signal to the slicer, the AGC component and the echo canceller each being coupled to the DFE, and the remote retrain detection component being coupled to the AGC component, and wherein the plurality of operational parameters comprise:

a target power level of the AGC component;

a retrain power threshold used by the remote retrain detection component;

an adaptation step size used to adapt filter coefficients associated with the echo canceller;

an adaptation step size used to adapt filter coefficients associated with the feed forward section;

a first scaling factor applied by the first scaling unit to the feed back signal; and a second scaling factor applied by the second scaling unit to the adder output signal.

23. A method as recited in claim 22, wherein the step of adjusting the plurality of operational parameters comprises the steps of:

scaling the target power level of the AGC component;

scaling the retrain power threshold;

scaling the adaptation step size used to adapt filter coefficients associated with the echo canceller;

scaling the adaptation step size used to adapt filter coefficients associated with the feed forward section;

setting the first scaling factor to a first value; and setting the second scaling factor to a second value.

24. A method of operating a dual power mode modem, comprising the steps of:

determining a power limit for a received signal;

classifying the power limit as one of high and normal;

selecting a digital impairment learning (DIL) sequence based on the power limit comprising selecting a long DIL sequence if the power limit high.

25. A method as recited in claim 24, wherein the step of determining the power limit comprises the step of:

receiving a message from a remote modem that contains the power limit.

26. A method as recited in claim 24, wherein the long DIL sequence comprises:

a short DIL sequence section comprising a first subset of symbols selected from a plurality of symbols;

a guard segment; and a high power section comprising a second subset of symbols selected from the plurality of symbols, each of the plurality of symbols having a power level associated therewith such that the power levels associated with the second subset of symbols are greater than the power levels associated with the first subset of symbols.

27. A method as recited in claim 26, wherein the step of selecting the DIL sequence comprises the step of:

selecting the short DIL sequence if the power limit is normal.

28. A method as recited in claim 26, wherein the plurality of symbols comprises a plurality of Ucodes ranging from 0 to 122, the first subset of symbols comprises the Ucodes 0 through 110, and the second subset of symbols comprises the Ucodes 111 through 120.

29. A computer program product for operating a dual power rode modem comprising an adaptive digital filter, comprising:

a computer readable storage medium having computer readable program code embodied therein, the computer readable program code comprising:

computer readable program code for determining a power limit for a received signal; and computer readable program code for adjusting at least one operational parameter for the modem based on the power limit wherein the at least one operational parameter comprises an adaptation step size used to adapt coefficients associated with the adaptive digital filter.

30. A computer program product as recited in claim 29, wherein the computer readable program code for determining the power limit comprises:

computer readable program code for receiving a message from a remote modem that contains the power limit.

31. A computer program product as recited in claim 29, wherein the modem further comprises an automatic gain control (AGC) component and wherein the at least one operational parameter comprises a target power level of the AGC component.

32. A computer program product as recited in claim 31, wherein the modem further comprises a remote retrain detection component coupled to the AGC component and wherein the at least one operational parameter comprises a retrain power threshold used by the remote retrain detection component.

33. A computer program product as recited in claim 29, wherein the at least one operational parameter comprises at least one scaling factor applied to an internal signal of the modem.

34. A computer program product as recited in claim 29, wherein the computer readable program code for adjusting at least one operational parameter comprises:

computer readable program code for adjusting a plurality of operational parameters for the modem based on the power limit.

35. A computer program product as recited in claim 34, wherein the modem comprises an automatic gain control (AGC) component, a remote retrain detection component, an echo canceller, a decision feedback equalizer (DFE) that includes a feed forward section that generates a feed forward output signal and a feed back section that generates a feed back output signal, an adder that subtracts the feed back output signal from the feed forward output signal to generate an adder output signal, a first scaling unit that couples the feed back output signal to the adder, a slicer, and a second scaling unit that couples the adder output signal to the slicer, the AGC component and the echo canceller each being coupled to the DFE, and the remote retrain detection component being coupled to the AGC component, and wherein the plurality of operational parameters comprise:

a target power level of the AGC component;

a retrain power threshold used by the remote retrain detection component;

an adaptation step size used to adapt filter coefficients associated with the echo canceller;

an adaptation step size used to adapt filter coefficients associated with the feed forward section;

a first scaling factor applied by the fist scaling unit to the feed back signal; and a second scaling factor applied by the second scaling unit to the adder output signal.

36. A computer program product as recited in claim 35, wherein the computer readable program code for adjusting the plurality of operational parameters comprises:

computer readable program code for scaling the target power level of the AGC component;

computer readable program code for scaling the retrain power threshold;

computer readable program code for scaling the adaptation step size used to adapt filter coefficients associated with the echo canceller;

computer readable program code for scaling the adaptation step size used to adapt filter coefficients associated with the feed forward section;

computer readable program code for setting the first scaling factor to a first value; and computer readable program code for setting the second scaling factor to a second value.

37. A computer program product for operating a dual power mode modem, comprising:

a computer readable storage medium having computer readable program code embodied therein, the computer readable program code comprising:

computer readable program code for determining a power limit for a received signal and classifying the power limit as one of high and normal; and computer readable program code for selecting a digital impairment learning (DIL) sequence based on the power limit comprising computer readable program code for selecting a long DIL sequence if the power limit is high.

38. A computer program product as recited in claim 37, wherein the computer readable program code for determining the power limit comprises:

computer readable program code for receiving a message from a remote modem that contains the power limit.

39. A computer program product as recited in claim 37, wherein the long DIL sequence comprises:

a short DIL sequence section comprising a first subset of symbols selected from a plurality of symbols;

a guard segment; and a high power section comprising a second subset of symbols selected from the plurality of symbols, each of the plurality of symbols having a power level associated therewith such that the power levels associated with the second subset of symbols are greater than the power levels associated with the first subset of symbols.

40. A computer program product as recited in claim 39, wherein the computer readable program code for selecting the DIL sequence comprises:

computer readable program code for selecting the short DIL sequence if the power limit is normal.

41. A computer program product as recited in claim 39, wherein the plurality of symbols comprises a plurality of Ucodes ranging from 0 to 122, the first subset of symbols comprises the Ucodes 0 through 110, and the second subset of symbols comprises the Ucodes 111 through 120.

* * * * *